United States Patent [19]

Watanabe et al.

[11] Patent Number: 5,712,497
[45] Date of Patent: Jan. 27, 1998

[54] AMPLIFYING TYPE PHOTOELECTRIC CONVERTING DEVICE AND AMPLIFYING TYPE SOLID-STATE IMAGING APPARATUS USING THE SAME

[75] Inventors: Takashi Watanabe, Soraku-gun; Hiroaki Kudo, Nara, both of Japan

[73] Assignee: Sharp Kabushiki Kaisha, Osaka, Japan

[21] Appl. No.: 612,369

[22] Filed: Mar. 7, 1996

[30] Foreign Application Priority Data

Mar. 10, 1995 [JP] Japan .................... 7-051641

[51] Int. Cl.⁶ .................................. H01L 27/148
[52] U.S. Cl. .................... 257/218; 257/229; 257/230; 257/250; 257/448; 257/462; 257/291
[58] Field of Search ................... 257/218, 223, 257/229, 230, 241, 249, 250, 291, 445, 448, 462

[56] References Cited

U.S. PATENT DOCUMENTS 5,285,091 2/1994 Hamasaki .................... 257/291

OTHER PUBLICATIONS

T. Nakamura, K. Matsumoto, R. Hyuga, & A. Yusa of Olympus Optical Co., Ltd. "Gate Accumulating Type MOS Phototransistor Image Sensor," in *Proceedings of the 1986 National Convention of the Institute of Television Engineers of Japan*, 1986.

J. Hynecek of Texas Instruments Inc., "A New Device Architecture Suitable for High-Resolution and High-Performance Image Sensors," in *IEEE Transactions On Electron Devices*, vol. 35, No. 5, May 1988, pp. 646–652.

J. Hynecek of Texas Instruments, Inc., "BCMD—An Improved Photosite Structure for High-Density Image Sensors," in *IEEE Transactions On Electron Devices*, vol. 38, No. 5, May 1991, pp. 1011–1020.

*Primary Examiner*—Minh-Loan Tran
*Attorney, Agent, or Firm*—David G. Conlin; Milton Oliver

[57] ABSTRACT

An amplifying type photoelectric converting device is disclosed. The device includes: a semiconductor substrate of a first conductive type; a well portion of a second conductive type for accumulating signal charges generated by photoelectric conversion; a semiconductor region of the first conductive type provided in a region in the well portion; a first gate region including a first electrode; and a second gate region being adjacent to the first gate region and including a second electrode. An active element is formed between the semiconductor region and the semiconductor substrate, and a change in an operational characteristic of the active element which is generated by the signal charges is used as an output signal.

24 Claims, 23 Drawing Sheets

AMPLIFYING TYPE PHOTOELECTRIC CONVERTING DEVICE AND AMPLIFYING TYPE SOLID-STATE IMAGING APPARATUS USING THE SAME

BACKGROUND OF THE INVENTION

1. Field of the Invention

The present invention relates to an amplifying type photoelectric converting device and an amplifying type solid-state imaging apparatus using such a device.

2. Description of the Related Art

At present, a charge-coupled device (CCD) is predominantly used in a solid-state imaging apparatus in a variety of fields. The CCD type solid-state imaging apparatus is operated in such a manner that a signal charge photo. electrically converted and accumulated in a photodiode or MOS diode is introduced via a CCD transfer channel into a charge sensing section having a high sensitivity. The signal charge is converted into a voltage signal in the charge sensing section. This results in a high S/N ratio and a large output voltage.

As the size of the solid-state imaging apparatus is reduced and the number of pixels is increased, however, the size of the pixel is further minimized. Accordingly, the amount of charges which the CCD can transfer is reduced. This causes a serious problem that a dynamic range is deteriorated. Furthermore, since the entire CCD is driven by clocks in several phases, the CCD type apparatus has a large load capacitance and requires a high driving voltage. Therefore, as the number of pixels is increased, the power consumption of the CCD type apparatus is drastically increased.

In order to cope with these problems, an amplifying type solid-state imaging apparatus adopting a new method is proposed. The proposed amplifying type solid-stage imaging apparatus is operated in such a manner that a signal charge generated in each pixel is not read out as it is, but the signal is amplified in the pixel and then read out by a scanning circuit. According to this method, the limitation of an amount of signals in connection with the readout is eliminated, so that even if the amount of the signal charges is reduced, the dynamic range is not deteriorated. Thus, such an amplifying type solid-state imaging apparatus has a much better dynamic range than the CCD type solid-state imaging apparatus. In addition, according to this method, it is sufficient to drive only the horizontal and vertical lines that include pixels from which the signal is to be read out, and the drive can be effected at a low voltage. As a result, the amplifying type solid-state imaging apparatus consumes less power than the CCD type solid-state imaging apparatus.

In the amplifying type solid-state imaging apparatus, a transistor is generally used in order to amplify a signal in a pixel. Transistors of SIT type, bipolar type, and FET type (including MOS type and junction type) are known for this purpose. When the MOSFET is used for amplifying a signal, the scanning circuit for readout can generally have a simple structure. Therefore, the FET type solid-state imaging apparatus is much better as compared with amplifying type solid-state imaging apparatuses using the other type transistors in that the structure thereof can be simplified.

Among the FET type solid-state imaging apparatuses, the one in which a single FET is included in a pixel is advantageous in that the pixel density is increased. As such an FET type solid-state imaging apparatus, CMD type, FGA type and BCMD type are reported. For example, a CMD type solid-state imaging apparatus is reported in "Gate accumulating type MOS phototransistor image sensor" by T. Nakamura et al., 1986 National Convention of the Institute of Television Engineers of Japan No. 3–7. Furthermore, an FGA type amplifying type solid-state imaging apparatus is reported, for example, in "A New Device Architecture Suitable for High-Resolution and High-Performance Image Sensor" by J. Hynecek, IEEE trans. Elec. Dev., Vol. 35, No. 5, pp. 646–652 (1988). Moreover, a BCMD type amplifying type solid-state imaging apparatus is reported, for example, in "BCMD-An Improved Photosite Structure for High Density Image Sensor" by J. Hynecek, IEEE Trans. Elec. Dev., Vol. 38, No. 5, pp.1011–1020 (1991).

These conventional amplifying type solid-state imaging apparatuses will be described with reference to the accompanying drawings below.

FIGS. 21A through 21C show a pixel of a CMD type solid-state imaging apparatus. FIG. 21A is a plan view of the pixel. FIG. 21B is a cross sectional view at a line 21B—21B shown in FIG. 21A. FIG. shows a potential distribution in the direction of the depth in a cross section at a line 21C—21C shown in FIG. 21B.

As shown in FIGS. 21A and 21B, an n-type well 2 is formed in a surface region of a p-type substrate 1 as a buried channel. An annular gate electrode 3 is formed on the n-type well 2 via an insulating film 6. A source region 4 and a drain region 5 made of a high concentration n-type region, which are separated by the gate electrode 3 from each other, are also formed on the n-type well 2.

This CMD type amplifying type solid-state imaging apparatus is driven in the following method. First, at the time of accumulating signals, a voltage $V_L$ is applied to the gate electrode 3, and signal charges consisting of holes generated by photoelectric conversion are accumulated in the proximity of an interface with the insulating film 6 of the n-type well 2. At the time of reading out the signals, a voltage $V_M$ is applied to the gate electrode 3. At this time, a current flowing between the drain and the source is changed in accordance with the amount of the signal charges. The value obtained as a result of the change is read out as a signal output. Since the voltage $V_L$ is applied to gate electrodes in the other pixels on the same signal line, no signal charge is sensed.

In a resetting operation of clearing the signal charge and preparing for accumulating the next signal, a voltage $V_H$ is applied to the gate electrode 3, so as to generate a potential gradient in which the potential gradually decreases in the direction of the depth. As a result, the signal charges accumulated in the proximity of the interface with the insulating film 6 of the n-type well 2 are discharged into the internal portion of the substrate.

FIGS. 22A and 22B show a pixel of an FGA type solid-state imaging apparatus. FIG. 22A is a cross sectional view of the pixel portion thereof. FIG. 22B shows a potential distribution in the direction of the depth in a cross section at a line 22B—22B shown in FIG. 22A.

As shown in FIGS. 22a and 22B, the FGA type solid-state imaging apparatus is different from the CMD type solid-state imaging apparatus in that a p⁺ layer 9 of a higher concentration than the p-type substrate 1 is formed on the n-type well 2 below the gate electrode 3 so that the p⁺ layer 9 circularly surrounds the source region 4 formed of an n⁺ layer. Since it is sufficient that the gate electrode 3 is capacitively coupled with the p⁺ layer 9, the gate electrode 3 only partially covers the p⁺ layer 9.

At the time of accumulating signals and reading out signals, the voltage $V_L$ is applied to the gate electrode 3, and a change of a channel potential of the n-type well layer 2, caused by the accumulation of the signal charges consisting of holes in the p⁺ layer 9, is read out as a change of a threshold. Since the voltage $V_L$ is applied to gate electrodes in the other pixels on the same signal line, no signal charge is sensed.

A resetting operation is the same as in the CMD type solid-state imaging apparatus. The voltage $V_H$ is applied to the gate electrode 3, so as to generate a potential gradient in which the potential gradually decreases in the direction of the depth. As a result, the signal charges accumulated in the p⁺ layer 9 are discharged into the internal portion of the substrate.

FIGS. 23A and 23B show a pixel of a BCMD type solid-state imaging apparatus. FIG. 23A is a cross sectional view of the pixel portion thereof. FIG. 23B shows a potential distribution in the direction of the depth in a cross section at a line 23B—23B shown in FIG. 23A.

As shown in FIGS. 23A and 23B, in the BCMD type solid-state imaging apparatus, a gate electrode 3 is formed so as to surround a source region 14 formed of a p⁺ layer. The drain region 15 formed of a p⁺ layer is formed outside the gate electrode 3. Below the gate electrode 3 is a semiconductor multilayers consisting of a p-type layer 13, an n-type layer 12, a p-type layer 11, and an n-type layer 10 formed via an insulating film 6. The semiconductor multilayers function as a region for photoelectric conversion. The BCMD type solid-state imaging apparatus is different from the aforementioned FGA solid-state imaging apparatus in that the signal charges consisting of electrons are accumulated in the n-type layer 12 for working as a buried channel, a change of the potential of the p-type layer 13 due to the signal charge is sensed as a threshold change of P-MOS, and during a resetting operation, a gate voltage is lowered to be $V_L$, and the signal charges are discharged into the substrate, which is the n-type substrate 10. By such a structure, the signal charges can be completely transferred.

In the aforementioned CMD type solid-state imaging apparatus, a large quantity of dark current is disadvantageously generated due to the depletion at the interface between the semiconductor and the insulating film in the dark.

Moreover, there is another problem in that since an optically effective depth is small, the sensitivity to light having a long wavelength is low. This problem will be discussed with respect to FIG. 24. FIG. 24 shows the relationship between the amount of carriers generated when light is incident to a semiconductor and the wavelengths of the incident light, and the relationship between the amount of the carriers and the position in the semiconductor.

As shown in FIG. 24, since light having a short wavelength among visible light has a large absorption coefficient (a measurement of how much of light is absorbed in the semiconductor), the light incident to the semiconductor is entirely absorbed in the proximity of the surface thereof, and carriers are generated. On the other hand, since light having a long wavelength has a small absorption coefficient, the light proceeds far into the internal portion of the semiconductor. As a result, carriers are generated in a wide area from the surface to the internal portion of the semiconductor. Therefore, in order to perform a complete photoelectric conversion of the light having a long wavelength, it is necessary that the carriers generated in the area deep in the internal portion of the semiconductor are accumulated as signal charges and sensed.

As shown in FIG. 21C, in the conventional CMD type solid-state imaging apparatus, the potential is distributed in the photoelectric conversion region so that the peak with respect to holes is positioned in the internal portion of the semiconductor. Therefore, the carriers generated within the depth of a distance $l_p$, where the potential reaches the peak, are accumulated in the surface of the semiconductor, while the carriers generated farther than the depth of the distance $l_p$ are transported to the internal portion of the semiconductor along the potential gradient, so as not to be accumulated on the surface. Thus, in the case where light having a long wavelength is introduced to the photoelectric conversion region, the light which is not absorbed in the proximity of the surface and reach farther than the distance $l_p$ are not accumulated as the signal charge even if carriers are generated. As a result, the sensing sensitivity to light having a long wavelength is deteriorated.

In order to improve the sensing sensitivity to light having a long wavelength, the n-type well layer 2 can be made thick so as to extend the distance $l_p$. In this case, however, the driving voltage applied to the gate electrode 3 is required to be raised.

On the other hand, in the FGA solid-state imaging apparatus, since the p⁺ layer 9 is not subjected to depletion during the resetting operation, a dark current is suppressed. However, no depletion in the p⁺ layer 9 during the resetting operation means that the signal charges are not completely transported. This causes a problem of an increase in the generation of residual image and/or resetting noises. In addition, as indicated by the distance $l_p$ in FIG. 22B, an optically effective depth is the distance between the surface of the semiconductor layer and the middle of the n-type well layer 2, so that the problem of the deterioration in the sensitivity to light having a long wavelength is not solved.

The BCMD type solid-state imaging apparatus has other problems in that in order to form the multilayers from the p-type layer 11 to the p-type layer 13 in the semiconductor substrate 10, a complex production process is required, and that it is difficult to optimize driving conditions.

SUMMARY OF THE INVENTION

According to one aspect of the invention, an amplifying type photoelectric converting device includes: a semiconductor substrate of a first conductive type; a well portion of a second conductive type for accumulating signal charges generated by photoelectric conversion, the well portion being provided in one surface side of the semiconductor substrate; a semiconductor region of the first conductive type provided in a region in the one surface side of the well portion; a first gate region including a surface-proximate portion in a region excluding the semiconductor region in the well portion, an insulating film located on the surface-proximate portion, and a first electrode located on the insulating film; and a second gate region adjacent to the first gate region in the one surface side of the semiconductor substrate, the second gate region including a surface-proximate portion in the semiconductor substrate, an insulating film located on the surface-proximate portion in the semiconductor substrate, and a second electrode located on the insulating film. An active element having the surface-proximate portion of the first gate region as a channel is formed between the semiconductor region and the semiconductor substrate, and a change in an operational characteristic of the active element which is generated by the signal charges is used as an output signal.

According to another aspect of the invention, an amplifying type photoelectric converting device includes: a semiconductor substrate of a first conductive type; a well portion of a second conductive type for accumulating signal charges generated by photoelectric conversion, the well portion being provided in one surface side of the semiconductor substrate; a semiconductor region of the first conductive type provided in a region in the one surface side of the well portion; a first gate region including a surface-proximate portion in a region excluding the semiconductor region in the well portion, an insulating film located on the surface-proximate portion, and first electrode located on the insulating film; a second gate region adjacent to the first gate region in the one surface side of the semiconductor substrate, the second gate region including a surface-proximate portion in the semiconductor substrate, an insulating film located on the surface-proximate portion in the semiconductor substrate, and second electrodes located on the insulating film; and a reset drain region of the second conductive type provided in the one surface side of the semiconductor substrate. A first active element having the surface-proximate portion of the first gate region as a channel is formed between the semiconductor region and the semiconductor substrate, and a second active element having a region between the well portion and the reset drain region as a channel is formed. A change in an operational characteristic of the first active element which is generated by the signal charges is used as an output signal.

According to still another aspect of the invention, an amplifying type photoelectric converting device includes: a semiconductor substrate of a first conductive type; a well portion of a second conductive type for accumulating signal charges generated by photoelectric conversion, the well portion being provided in one surface side of the semiconductor substrate; a semiconductor region of the first conductive type provided in a region in the one surface side of the well portion; a first gate region including a surface-proximate portion in a region excluding the semiconductor region in the well portion, an insulating film located on the surface-proximate portion, and a first electrode located on the insulating film; a second gate region adjacent to the first gate region in the one surface side of the semiconductor substrate, the second gate region including a surface-proximate portion in the semiconductor substrate, an insulating film on the surface-proximate portion in the semiconductor substrate, and a second electrode on the insulating film; a third gate region adjacent to the first gate region in the one surface side of the well portion, the third gate region including a surface-proximate portion in the well portion, an insulating film located on the surface-proximate portion in the well portion, and a third electrode located on the insulating film; and a reset drain region of the second conductive type provided in the one surface side of the semiconductor substrate and adjacent to the surface-proximate portion in the third gate region. A first active element having the surface-proximate portion of the first gate region as a channel is formed between the semiconductor region and the semiconductor substrate, and a third active element having a region between the well portion and the reset drain region as a channel is formed. A change in an operational characteristic which is generated by the signal charges in the first active element is used as an output signal.

For each of the above-described devices, in one embodiment, the device further includes a first impurity layer of the first conductive type provided on the surface-proximate portion of the second gate region, the first impurity layer including an impurity of a concentration higher than in the semiconductor substrate. In another embodiment, the device further includes a second impurity layer of the first conductive type provided at least in the semiconductor substrate below the first gate region, the second impurity layer including an impurity of a concentration higher than in the semiconductor substrate.

According to still another aspect of the invention, an amplifying type solid-state imaging apparatus is provided. The apparatus includes: the amplifying type photoelectric converting device as described above; and a drive control section for controlling operation of the amplifying type solid-state imaging apparatus. The drive control section operates for the amplifying type photoelectric converting device such that: the drive control circuit applies to the first electrode a predetermined electric potential; and the drive control circuit applies to the second electrode an electric potential $V_M$ in a period of accumulating the signal charges in the well portion and an electric potential $V_L$ in a period of reading out the output signal, the electric potential $V_M$ functioning as a barrier against the signal charges and the output signal, the electric potential $V_L$ functioning as a barrier against the signal charges and accepting the output signal, thereby realizing control in which the accumulation of the signal charges and the readout operation of the output signal as the change in the operational characteristic of the active element caused by the signal charges are performed.

According to still another aspect of the invention, an amplifying type solid-state imaging apparatus is disclosed. The apparatus includes: the amplifying type photoelectric converting device as described above; and a drive control section for controlling operation of the amplifying type solid-state imaging apparatus. The drive control section operates for the amplifying type photoelectric converting device such that: in a period of reading out the output signal, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal; and in a period of accumulating charges in the well portion, the drive control section applies an electric potential $V_A'$ which is lower than the electric potential $V_A$ to the first electrode and an electric potential $V_M$ to the second electrode, the electric potential $V_M$ functioning as a barrier against the signal charges and output signal, thereby realizing control in which the accumulation of the signal charges and the readout operation of the output signal as the change in the operational characteristic of the active element caused by the signal charges are performed.

According to still another aspect of the invention, an amplifying type solid-state imaging apparatus is provided. The apparatus includes: the amplifying type photoelectric converting device as described above; and a drive control section for controlling operation of the amplifying type solid-state imaging apparatus. The drive control section operates for the amplifying type photoelectric converting device such that: the drive control section applies to the first electrode a predetermined electric potential; and the drive control section applies to the second electrode an electric potential $V_L$ in a period of reading out of the output signal, an electric potential $V_M$ in a period of accumulating the signal charges in the well portion, and an electric potential $V_H$ in a period of resetting, the electric potential $V_L$ functioning as a barrier against the signal charges and accepting the output signal, the electric potential $V_M$ functioning as a barrier against the signal charges and the output signal, the electric potential $V_H$ functioning as a barrier against the output signal and accepting the signal charges, thereby realizing control in which the accumulation of the signal charges, the readout operation of the output signal as the change in the operational characteristic of the first active element caused by the signal charges, and the discharging operation of the signal charges to the reset drain region are performed.

According to still another aspect of the invention, an amplifying type solid-state imaging apparatus is provided. The apparatus includes: the amplifying type photoelectric converting device as described above; and a drive control section for controlling operation of the amplifying type solid-state imaging apparatus. The drive control section operates for the amplifying type photoelectric converting device such that: in a period of reading out the output signal, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal; in a period of accumulating charges in the well portion, the drive control section applies an electric potential $V_A'$ which is lower than the electric potential $V_A$ to the first electrode and an electric potential $V_M$ to the second electrode, the electric potential $V_M$ functioning as a barrier against the signal charges and the output signal; and in a period of resetting, the drive control section applies an electric potential $V_H$ to the second electrode, the electric potential $V_H$ functioning as a barrier against the output signal and accepting the signal charges, thereby realizing control in which the accumulation of the signal charges, the readout operation of the output signal as the change in the operational characteristic of the first active element caused by the signal charges, and the discharging operation of the signal charges to the reset drain region are performed.

According to still another aspect of the invention, an amplifying type solid-state imaging apparatus is provided. The apparatus includes: the amplifying type photoelectric converting device as described above; and a drive control section for controlling operation of the amplifying type solid-state imaging apparatus. The drive control section operates for the amplifying type photoelectric converting device such that: the drive control section applies to the first electrode a predetermined electric potential; and in a period of reading out the output signal, the drive control section applies an electric potential $V_L$ to the second electrode and an electric potential $V_L'$ to the third electrode, the electric potential $V_L$ functioning as a barrier against the signal charges and accepting the output signal, the electric potential $V_L'$ functioning as a barrier against the signal charges and the output signal; in a period of accumulating charges in the well portion, the drive control section applies an electric potential $V_M$ to the second electrode and an electric potential $V_L''$ to the third electrode, the electric potentials $V_M$ and $V_L''$ both functioning as a barrier against the signal charges and the output signal; and in a period of resetting, the drive control section applies an electric potential $V_M'$ to the second electrode and an electric potential $V_H'$ to the third electrode, the electric potentials $V_M'$ functioning as a barrier against the signal charges and the output signal, the electric potentials $V_H'$ functioning as a barrier against the output signal, thereby realizing control in which the accumulation of the signal charges, the readout operation of the output signal as the change in the operational characteristic of the first active element caused by the signal charges, and the discharging operation of the signal charges to the reset drain region are performed.

According to still another aspect of the invention, an amplifying type solid-state imaging apparatus is provided. The apparatus includes: the amplifying type photoelectric converting device as described above; and a drive control section for controlling operation of the amplifying type solid-state imaging apparatus. The drive control section operates for the amplifying type photoelectric converting device such that: in a period of reading out the output signal, the drive control section applies an electric potential $V_A$ to the first electrode, an electric potential $V_L$ to the second electrode and an electric potential $V_L'$ to the third electrode, the electric potential $V_A$ making a surface potential below the first electrode higher than an electric potential of the semiconductor substrate, the electric potential $V_L$ functioning as a barrier against the signal charges and accepting the output signal, the electric potential $V_L'$ functioning as a barrier against the signal charges and the output signal; in a period of accumulating charges in the well portion, the drive control section applies an electric potential $V_A'$ which is lower than the electric potential Vato the first electrode, an electric potential $V_M$ to the second electrode and an electric potential $V_L''$ to the third electrode, the electric potentials $V_M$ and $V_L''$ both functioning as a barrier against the signal charges and the output signal; and in a period of resetting, the drive control section applies an electric potential $V_M'$ to the second electrode and an electric potential $V_H'$ to the third electrode, the electric potentials $V_M'$ functioning as a barrier against the signal charges and output signal, the electric potentials $V_H'$ functioning as a barrier against the output signal, thereby realizing control in which the accumulation of the signal charges, the readout operation of the output signal as the change in the operational characteristic of the first active element caused by the signal charges, and the discharging operation of the signal charges to the reset drain region are performed.

According to still another aspect of the invention, an amplifying type solid-state imaging apparatus is provided. The apparatus includes: a plurality of the amplifying type photoelectric converting devices each as described above, the semiconductor region of the respective amplifying type photoelectric converting devices being electrically connected with each other; and a drive control section for controlling operation of the amplifying type solid-state imaging apparatus. The drive control section operates such that: for one of the amplifying type photoelectric converting devices, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal, thereby reading out the output signal; and for the rest of the amplifying type photoelectric converting devices, the drive control section applies the electric potential $V_A$ or an electric potential $V_A'$ which is lower than the electric potential $V_A$ to the respective first electrodes, and an electric potential $V_M$ to the respective second electrodes, the electric potential $V_M$ functioning as a barrier against the signal charges and the output signal, thereby accumulating the signal charges.

According to still another aspect of the invention, an amplifying type solid-state imaging apparatus is provided. The apparatus includes a plurality of the amplifying type photoelectric converting devices each as described above. The amplifying type photoelectric converting devices are adjacently arranged in one direction or in two directions which are crossing with each other, the respective amplifying type photoelectric converting devices forming pixels, and the reset drain region in a stripe-shape or in an island-shape is provided between the adjacent pixels. Preferably, each of the pixels formed by the plurality of amplifying type photoelectric converting devices is separated from the adjacent pixels by the second electrode.

When a suitable voltage is applied to the first electrode (the first gate electrode), a potential is formed having such a distribution that the potential with respect to the major carriers in the well gradually decreases from the surface of the semiconductor substrate, and hits the bottom in the middle of the well, and gradually increases as proceeding towards the inner portion of the semiconductor substrate. For this reason, even if incident light to the semiconductor substrate generates signal charges of the major barriers by photoelectric conversion in a shallow portion in the semiconductor substrate, or generates signal charges by the photoelectric conversion in a deep portion in the semiconductor substrate, all the signal charges generated can be accumulated at the bottom of the potential in the middle of the well. Therefore, signal charges generated by light having a long wavelength which is subjected to the photoelectric conversion in the deep portion in the semiconductor substrate can be efficiently accumulated.

Furthermore, when a suitable voltage is applied to the first electrode, a channel for the minor carriers is formed in the surface-proximate portion in the first gate region. When a suitable voltage is applied to the second electrode, a channel is formed entirely in the semiconductor substrate below the second electrode including the surface-proximate portion in the second gate region. Therefore, a channel for allowing a current by the minor carriers to flow between the semiconductor substrate and the semiconductor region is formed.

The current flowing between the semiconductor substrate and the semiconductor region is varied in accordance with the amount of the accumulated signal charges. When a constant current is kept flowing between the semiconductor substrate and the semiconductor region, an electric potential is varied in accordance with the amount of the accumulated signal charges. When the constant electric potential is maintained, the current is varied in accordance with the amount of the accumulated signal charges.

When a suitable voltage is applied to the second electrode (the second gate electrode) so as to lower the potential barrier in the surface-proximate portion in the second gate region, the signal charges accumulated in the well flow to the reset drain region. Thus, the second gate electrodes can function as both the gate for sensing signal charges and the gate for resetting. In the case where a first impurity layer having an impurity concentration higher than that of the semiconductor substrate is provided below the second gate electrodes, the potential sharply changes in the proximity of the surface of the semiconductor substrate below the second gate electrode, and moderately changes in the internal portion thereof. Thus, a voltage to be applied to the second gate electrodes at the time of resetting can be reduced without lowering the surface potential.

Furthermore, the third electrode (the third gate electrode) can be provided in a part of the well so as to function as the reset gate in place of the second gate electrodes. In this case, the potential below the third gate electrode gradually decreases from the surface of the semiconductor substrate, hits the bottom in the middle of the well and gradually increases as proceeding towards the internal portion of the semiconductor substrate. Thus, since at the time of resetting, a potential with respect to signal charges lower than that below the first gate electrodes is formed, a voltage to be applied to the second gate electrodes can be smaller than the case where the second gate electrodes function as both the gate and the gate for resetting.

In the case where the amplifying type photoelectric converting device is driven by applying a DC voltage to the first electrode, it is sufficient to supply a common DC voltage to the first electrodes in each pixel. Accordingly, it is not necessary to take distortion or delay of a clock waveform caused by the resistance of the electrodes themselves into consideration, which otherwise could cause a problem in the case where a clock signal is applied to the electrodes. Thus, the thickness of the first electrodes can be reduced, as desired.

Furthermore, at the time of reading out signals from the amplifying type photoelectric converting device, an electrical potential by which the surface potential below the first gate electrodes is equal to the electrical potential of the semiconductor region is applied to the first electrodes. At the time of accumulating signal charges, an electrical potential lower than that at the time of reading out the signals is applied to the first gate electrodes. By such operations, the surface-proximate portion of the first gate region is filled with minor carriers supplied from the semiconductor region so as to suppress the dark current at the time of accumulating the signal.

Furthermore, a second impurity layer having an impurity concentration higher than that of the semiconductor substrate can be provided below the first gate region. As a result, a potential barrier can be formed so that signal charges generated in the neutralized region below the first gate electrodes is prevented from flowing to the adjacent pixel.

Thus, the invention described herein makes possible the advantages of (1) providing an amplifying type photoelectric converting device, capable of sensing light having a wavelength in a wide range from a short wavelength to a long wavelength in a high sensitivity in a simple structure, and significantly reducing a dark current, and (2) providing an amplifying type solid-state imaging apparatus using such an amplifying type photoelectric converting device.

These and other advantages of the present invention will become apparent to those skilled in the art upon reading and understanding the following detailed description with reference to the accompanying figures.

11

Figure 4A:
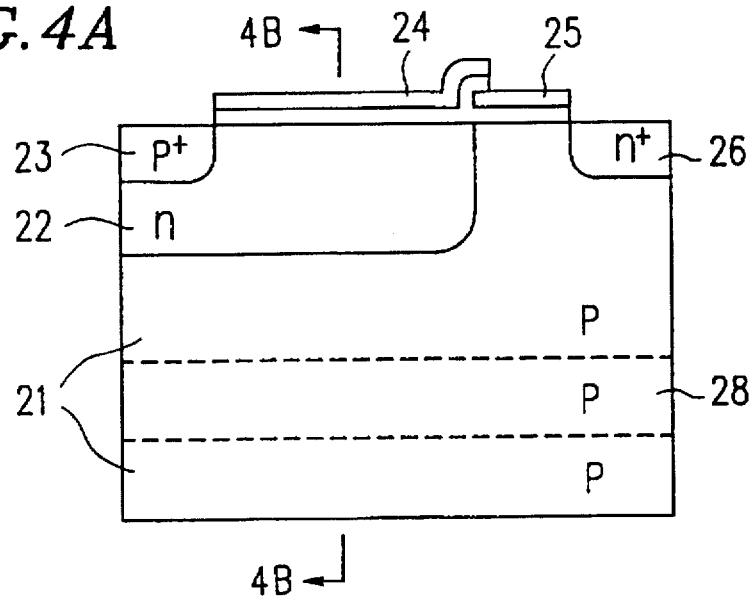
FIG. 4A is a cross sectional view of an amplifying type photoelectric converting device according to yet another example of the present invention.
Figure 4B:
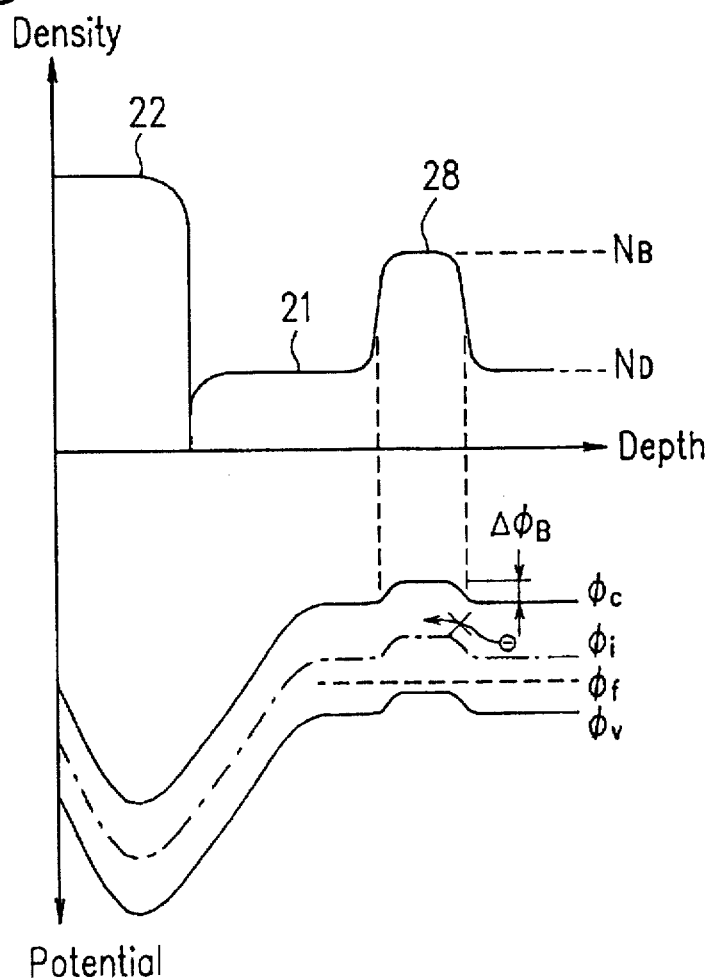

FIG. 4B shows a potential distribution in a substrate of a semiconductor at each operation of the amplifying type photoelectric converting device shown in FIG. 4A.

Figure 1:
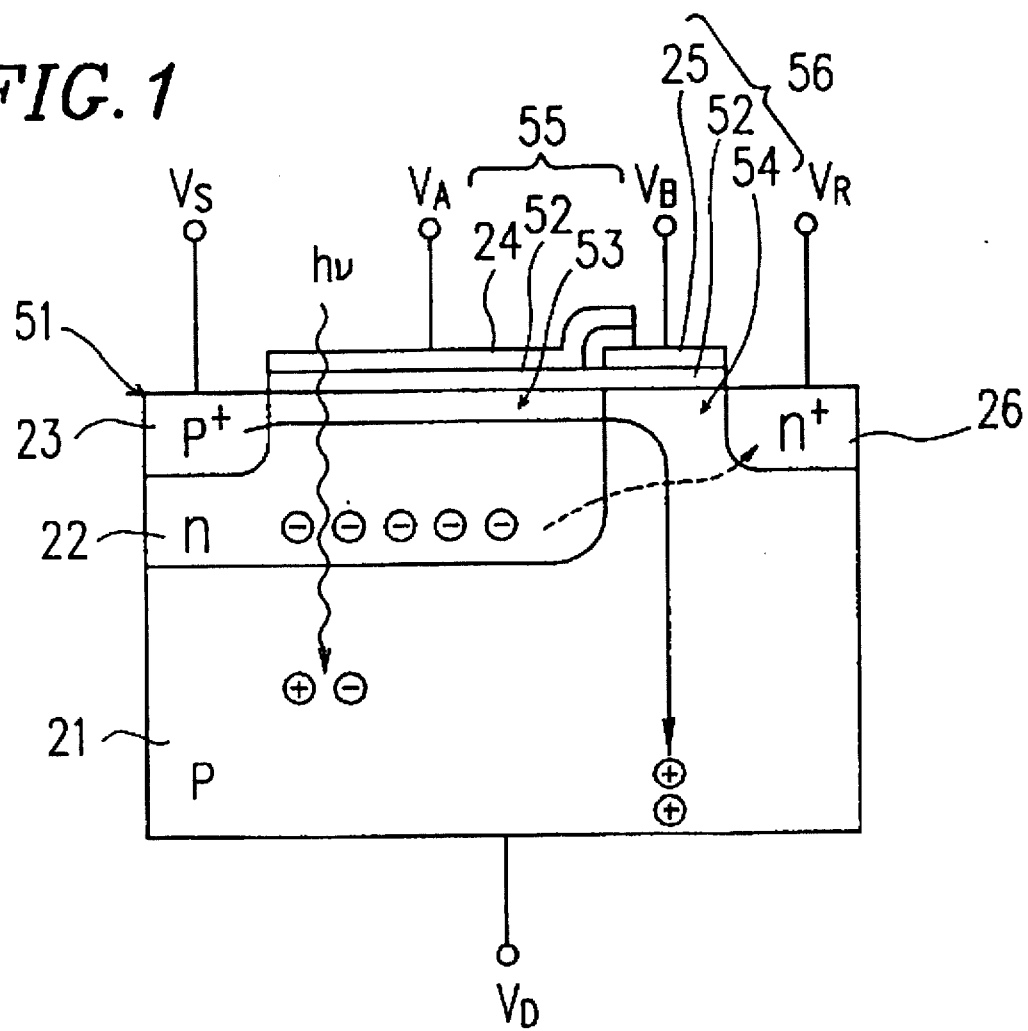
FIG. 1 is a cross sectional view of an amplifying type photoelectric converting device according to the present invention.
Figure 5A:
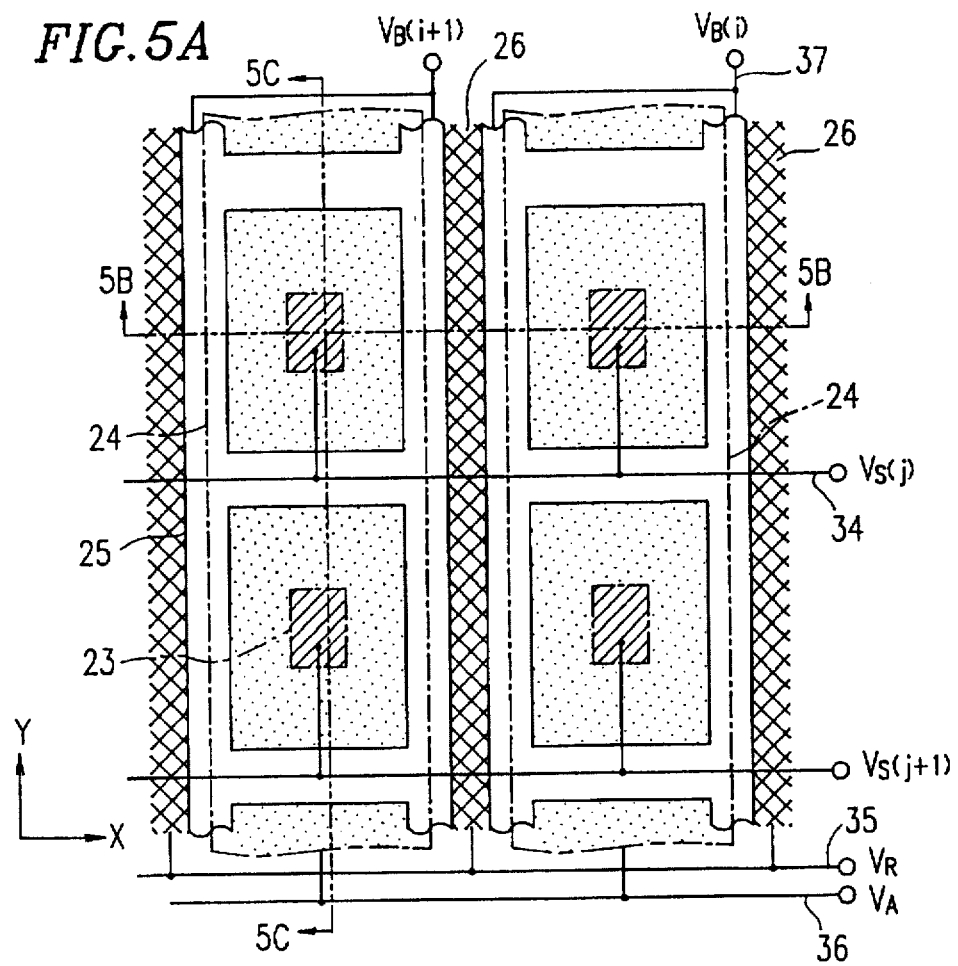

FIG. 5A is a plan view of a two dimensional image sensor using the amplifying type photoelectric converting device shown in FIG. 1.

Figure 5B:
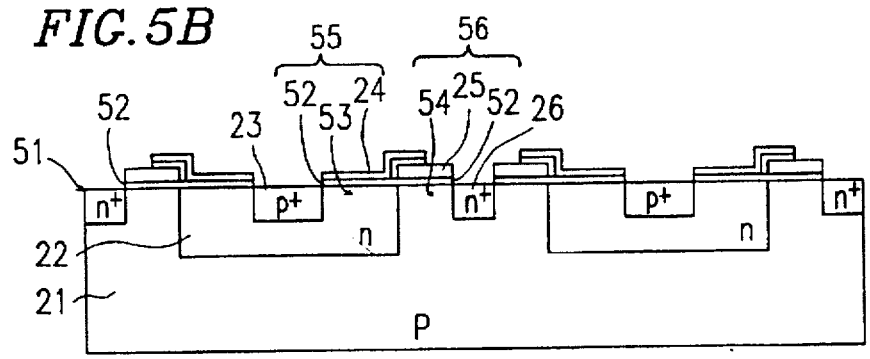
Figure 5C:
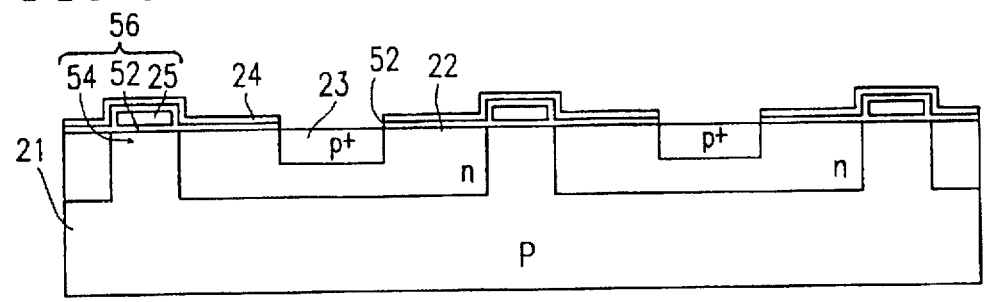

FIGS. 5B and 5C are cross sectional views of the two dimensional image sensor shown in FIG. 5A.

Figure 6A:
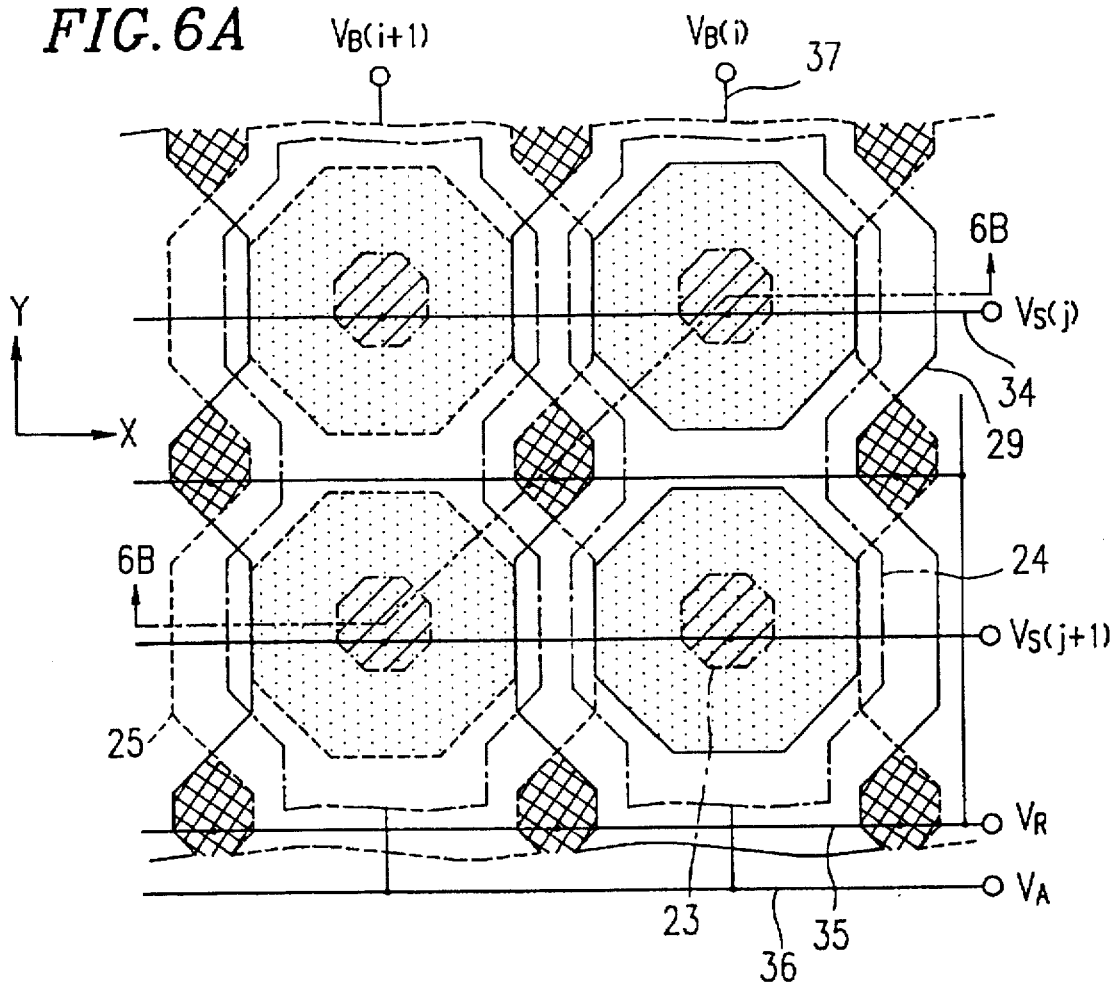

FIG. 6A is a plan view of a two dimensional image sensor using the amplifying type photoelectric converting device shown in FIG. 1.

Figure 6B:
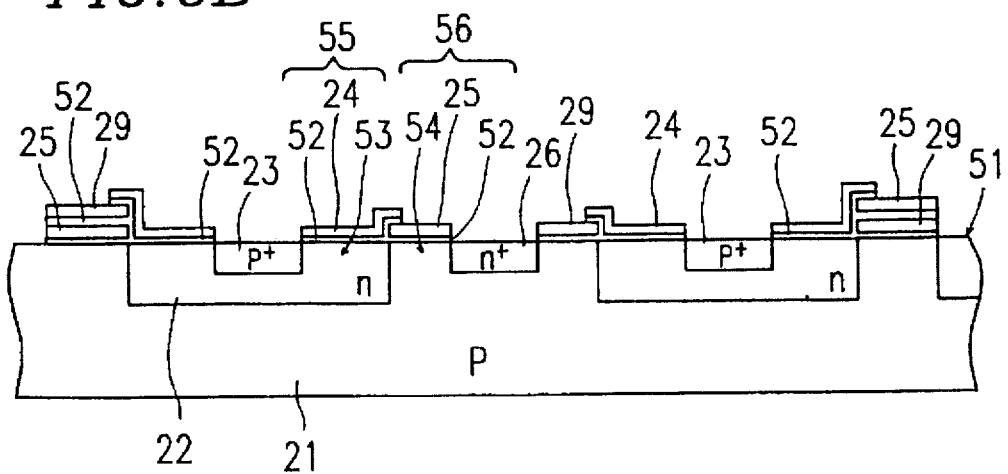

FIG. 6B is a cross sectional view of the two dimensional image sensor shown in FIG. 6A.

Figure 7:
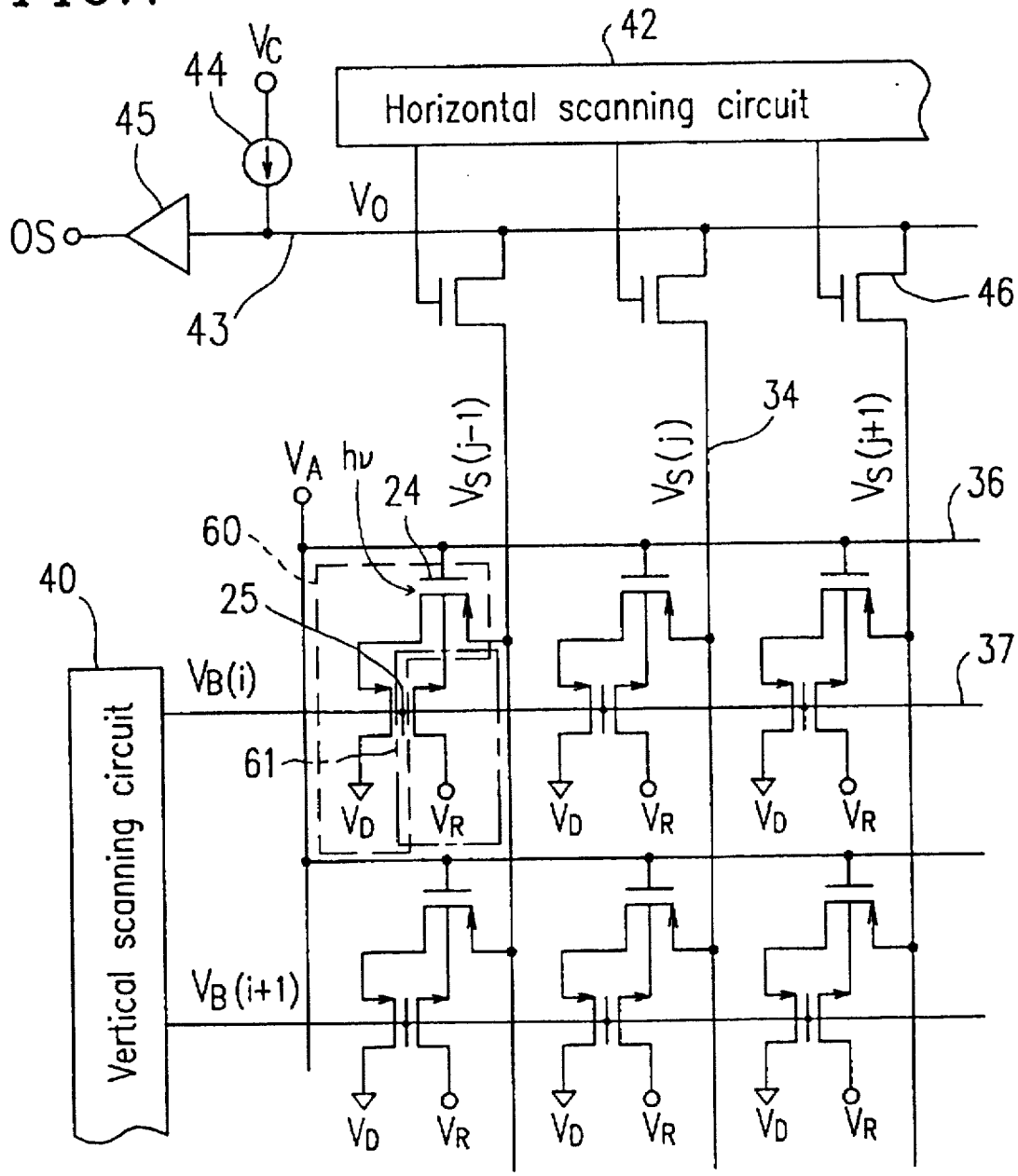

FIG. 7 shows a driving circuit for driving the two dimensional image sensors shown in FIGS. 5A–5C, and 6A–6B.

FIGS. 8A through 8D show timings of a driving signal for operating the driving circuit shown in FIG. 7.

Figure 9A:
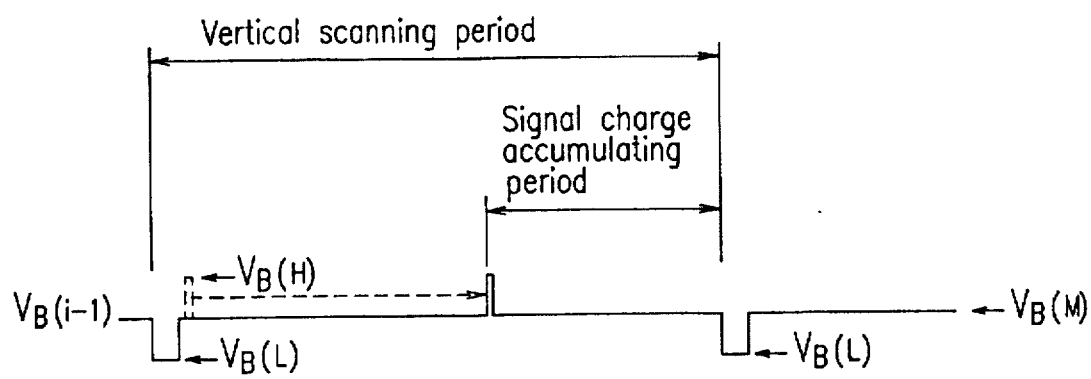
Figure 9B:
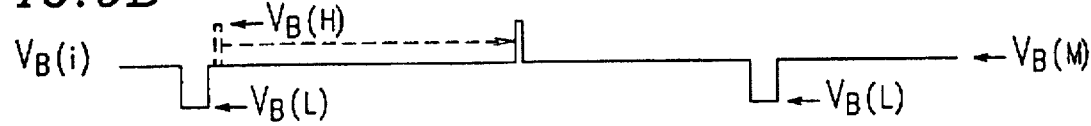
Figure 9C:
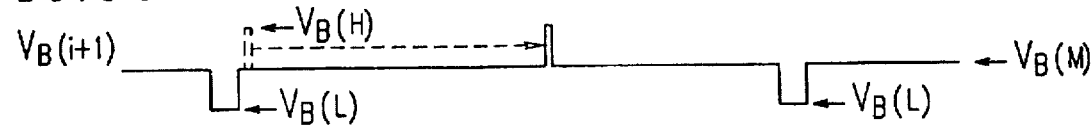

FIGS. 9A through 9C show driving timings in the case where a shuttering operation is conducted using the driving circuit shown in FIG. 7.

Figure 10A:
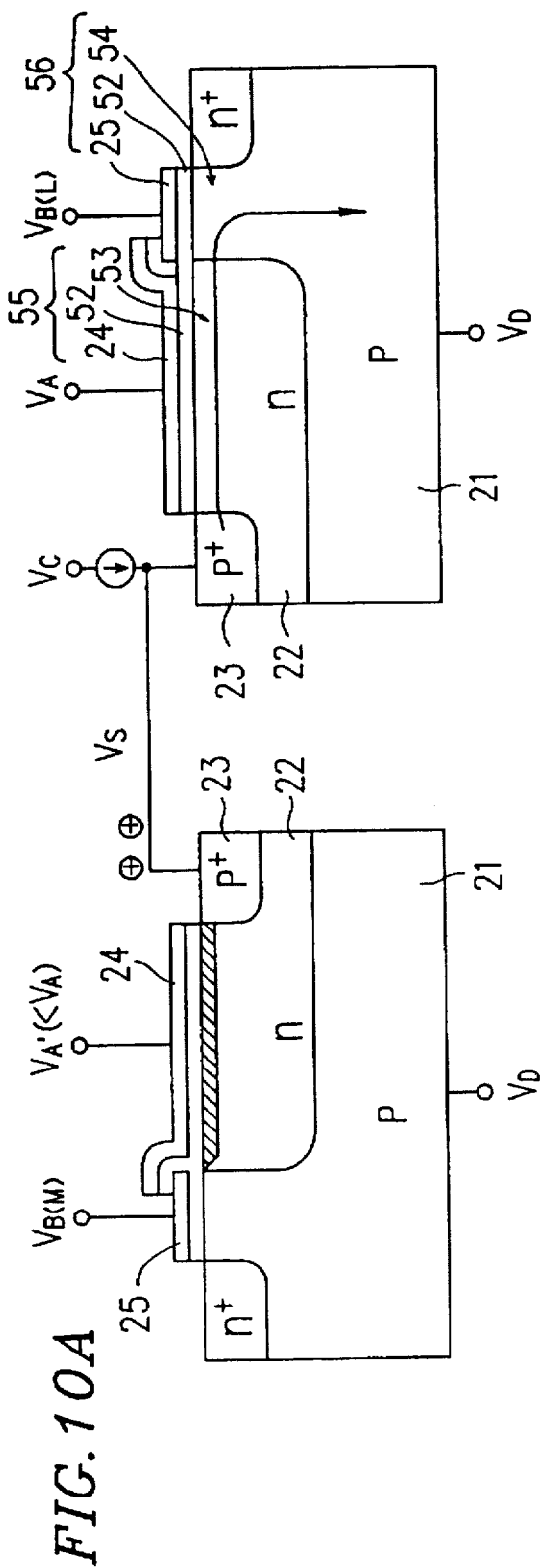

FIG. 10A is a cross sectional view of the amplifying type photoelectric converting device shown in FIG. 1, illustrating a method for suppressing a dark current.

Figure 10B:
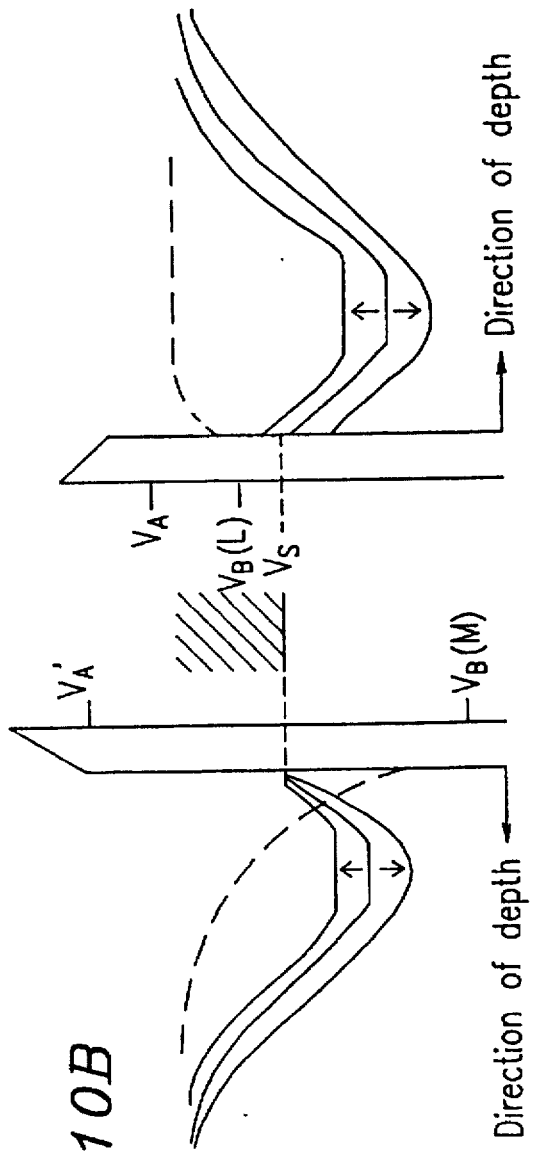

FIG. 10B shows a potential distribution in the substrate of the amplifying type photoelectric converting device shown in FIG. 10A.

Figure 11:
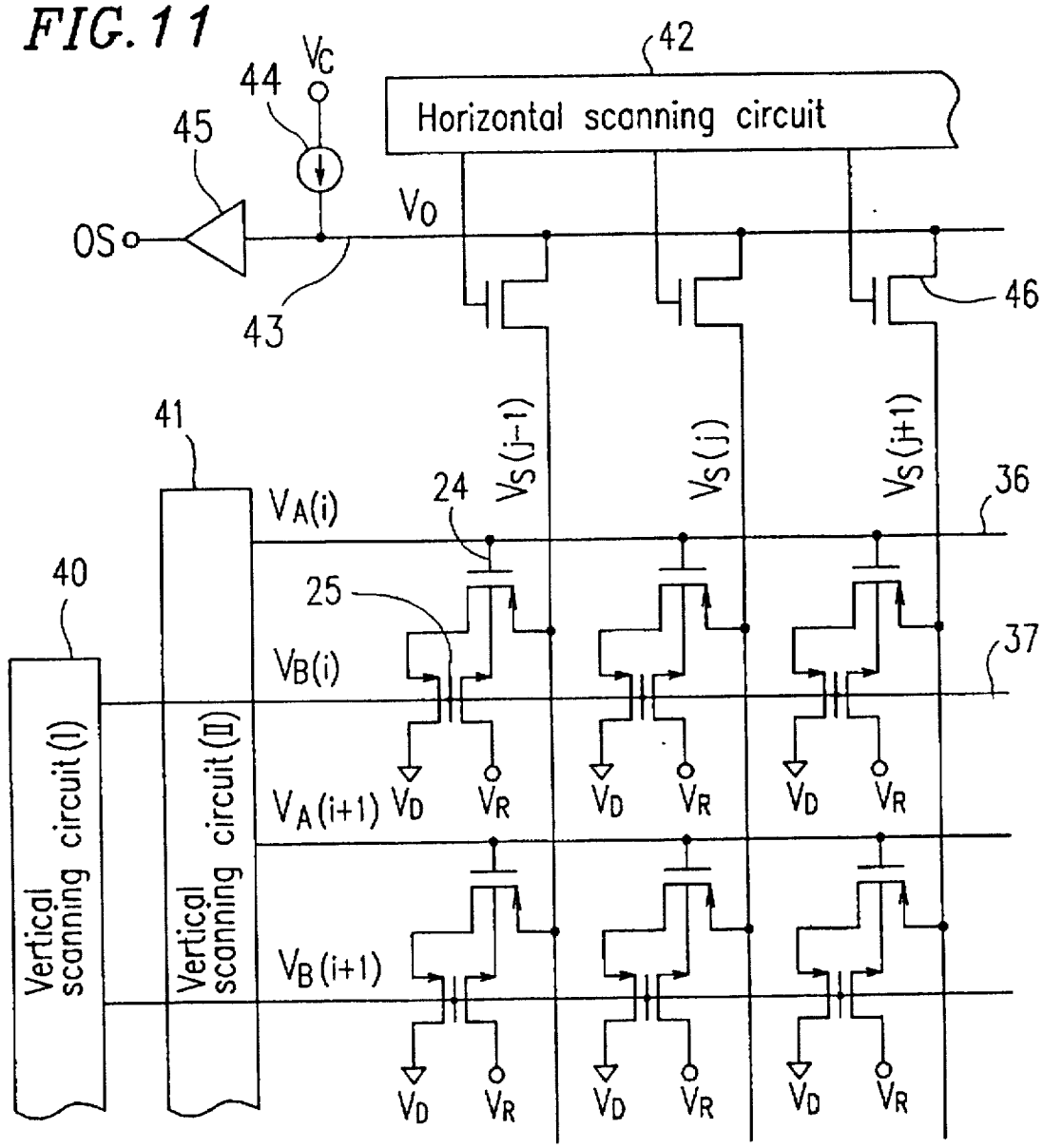
Figure 12A:
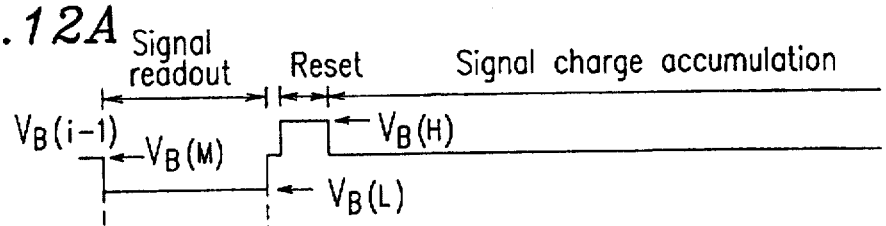
Figure 12B:
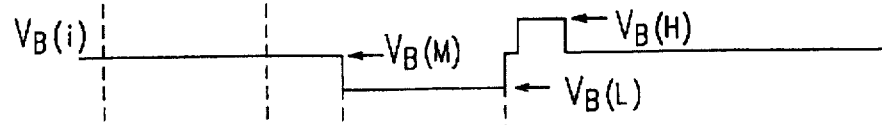
Figure 12C:
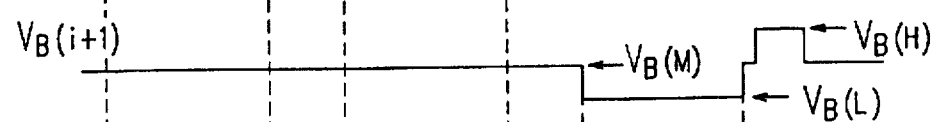
Figure 12D:
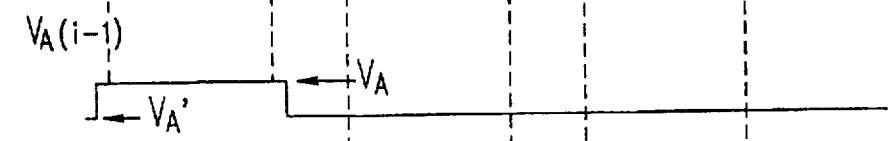
Figure 12E:
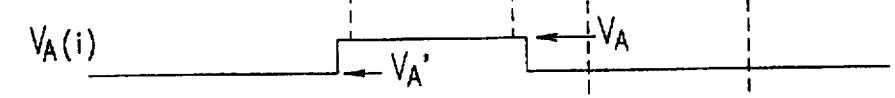
Figure 12F:
Figure 12G:
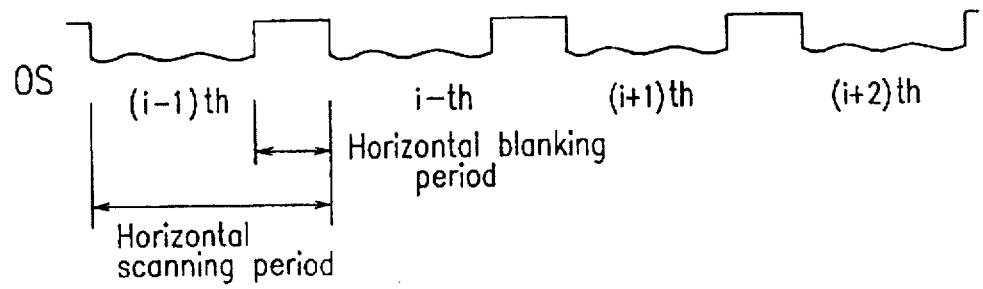

FIG. 11 shows a driving circuit of a two dimensional image sensor using the method for suppressing the dark current illustrated in FIGS. 10A and 10B.

FIGS. 12A through 12G show timings of a driving signal for operating the driving circuit shown in FIG. 11.

Figure 13:
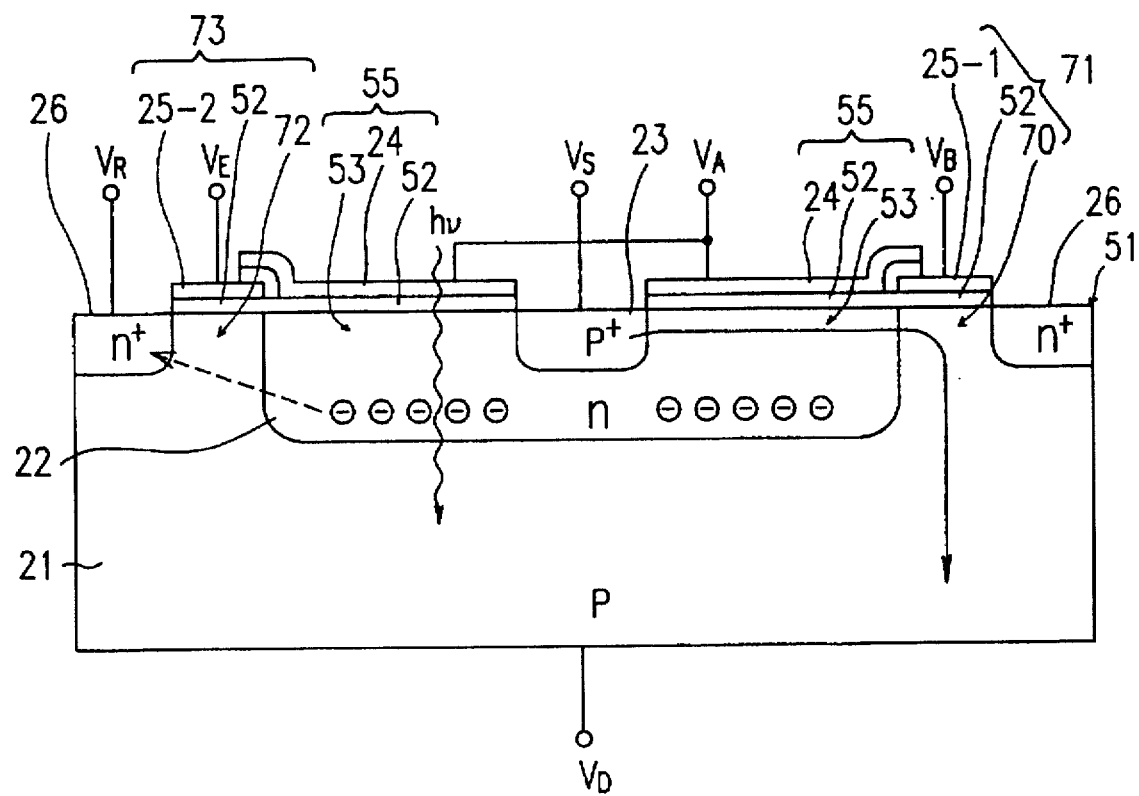

FIG. 13 is a cross sectional view of an amplifying type photoelectric converting device according to still another example of the present invention.

Figure 14A:
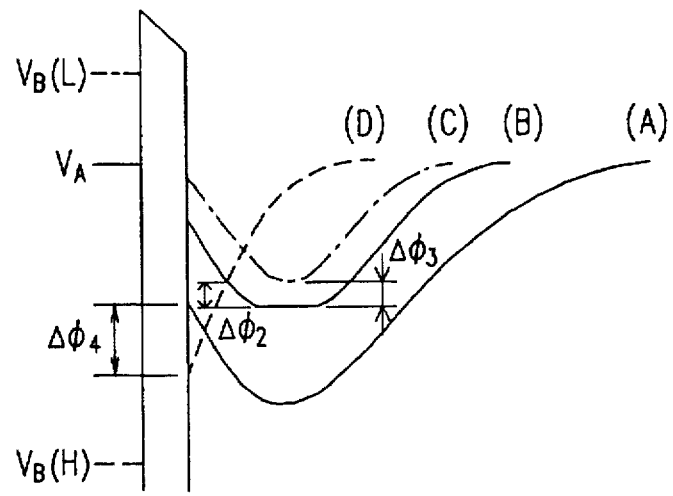
Figure 14B:
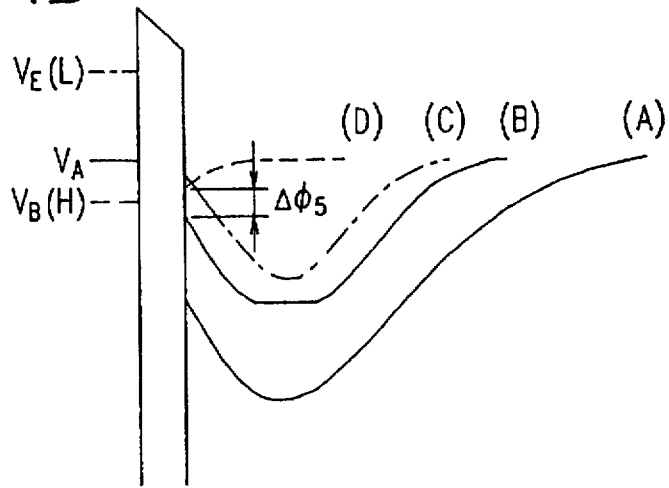
Figure 14C:
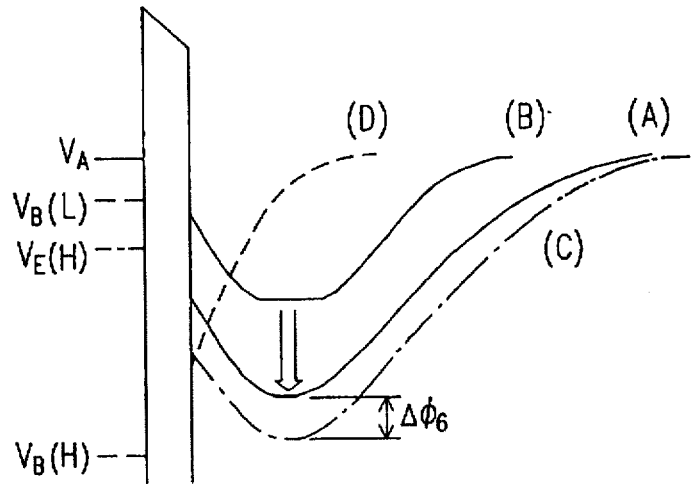
Figure 15A:
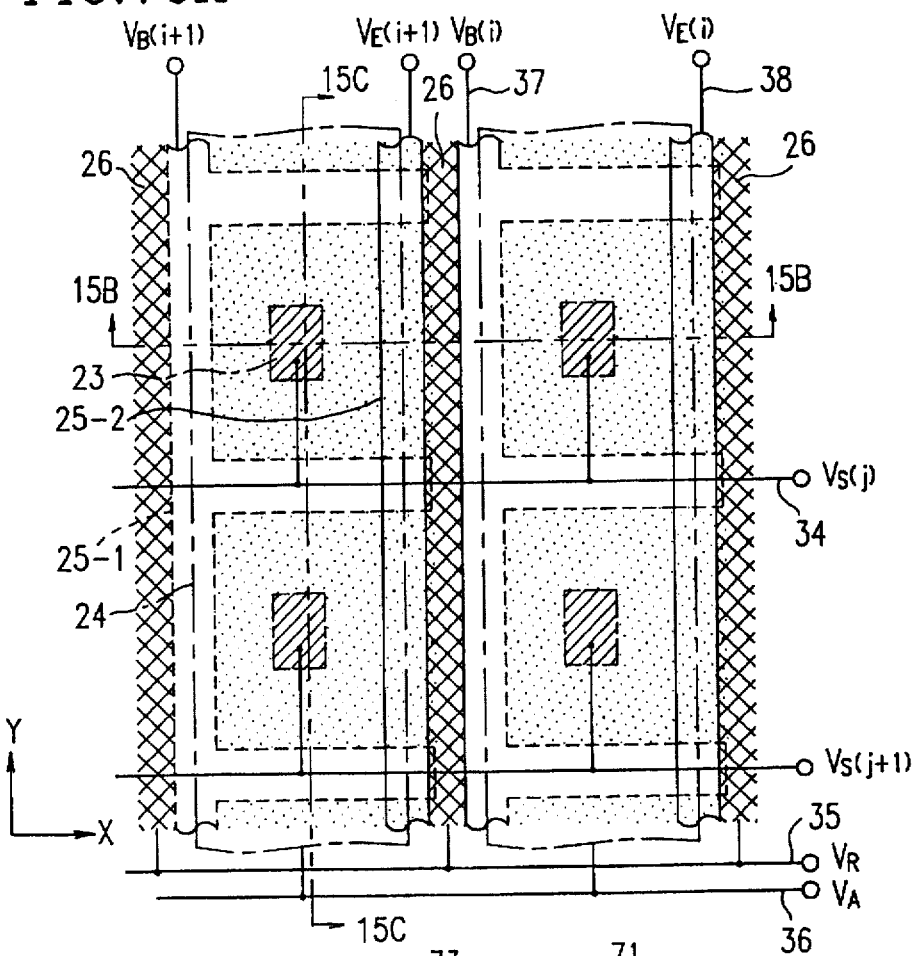

FIGS. 14A through 14C show potential distributions in the substrate of the amplifying type photoelectric converting device shown in FIG. 13 at the time of signal accumulation, signal readout, and reset, respectively FIG. 15A is a plan view of a two dimensional image sensor using the amplifying type photoelectric converting device shown in FIG. 13.

Figure 15B:
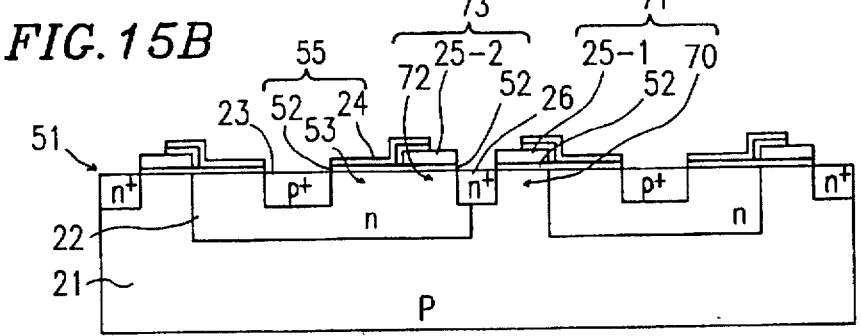
Figure 15C:
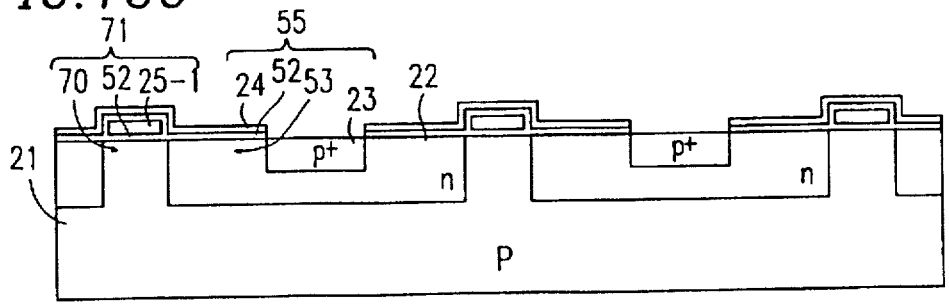

FIGS. 15B and 15C are cross sectional views of the two dimensional image sensor shown in FIG. 15A.

Figure 16A:
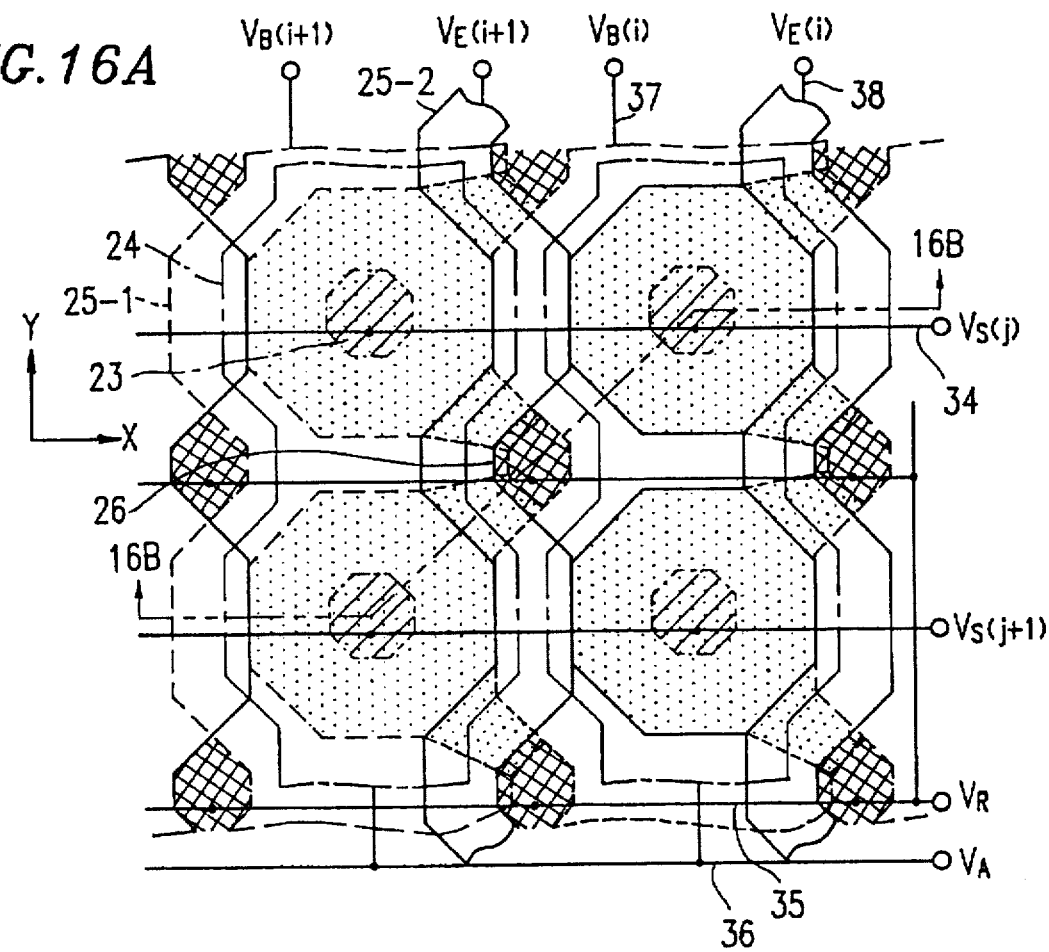

FIG. 16A is a plan view of another two dimensional image sensor using the amplifying type photoelectric converting device shown in FIG. 13.

Figure 16B:
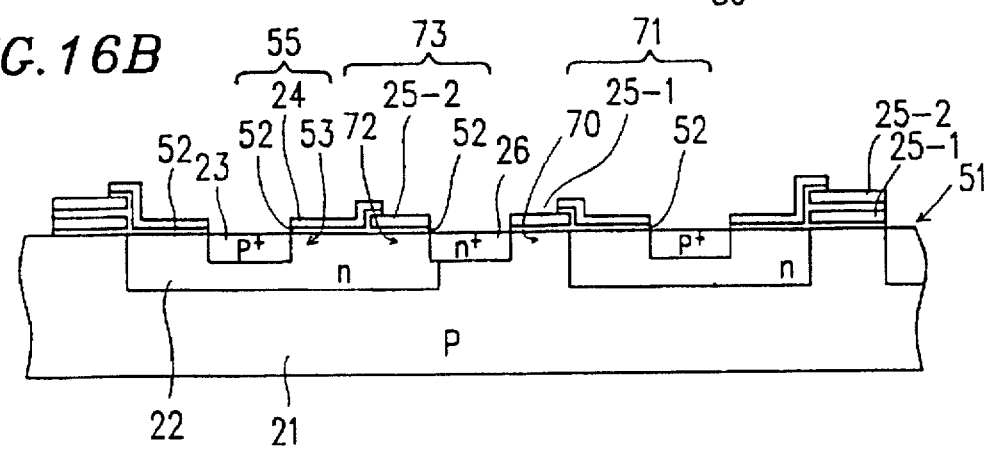

FIG. 16B is a cross sectional view of the two dimensional image sensor shown in FIG. 16A.

Figure 17:
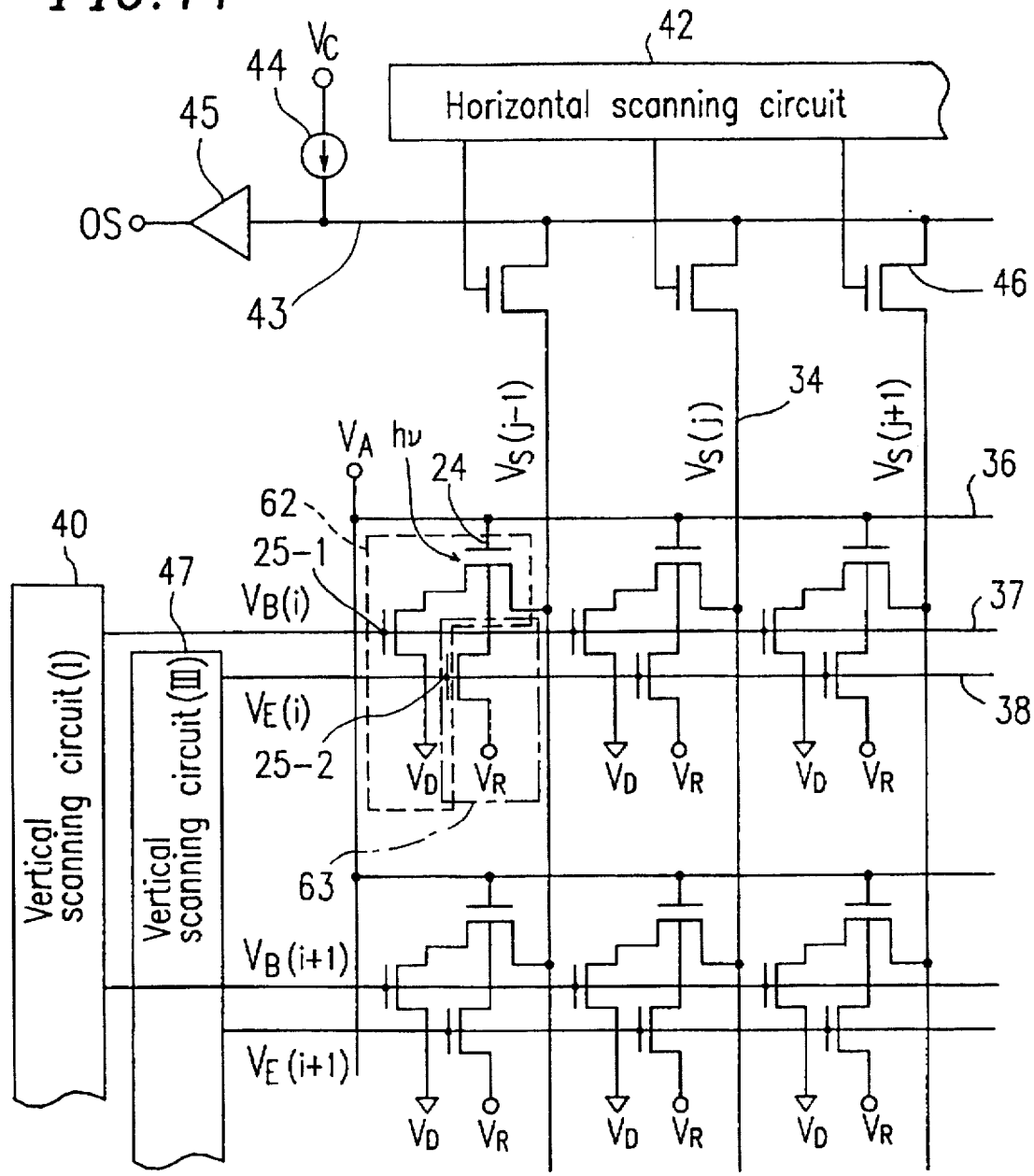

FIG. 17 shows a driving circuit for driving the two dimensional image sensors shown in FIGS. 15A–15C, and 16A–16B.

FIGS. 18A through 18G show timings of a driving signal for operating the driving circuit shown in FIG. 17.

Figure 19:
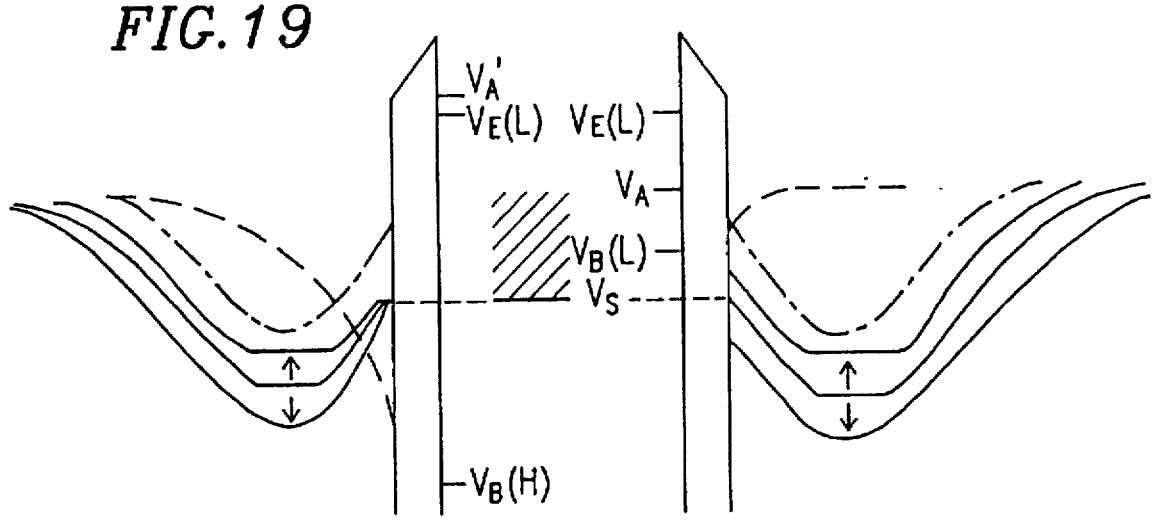

FIG. 19 shows a potential distribution in the substrate of the amplifying type photoelectric converting device shown in FIG. 13, illustrating a method for suppressing a dark current.

Figure 20:
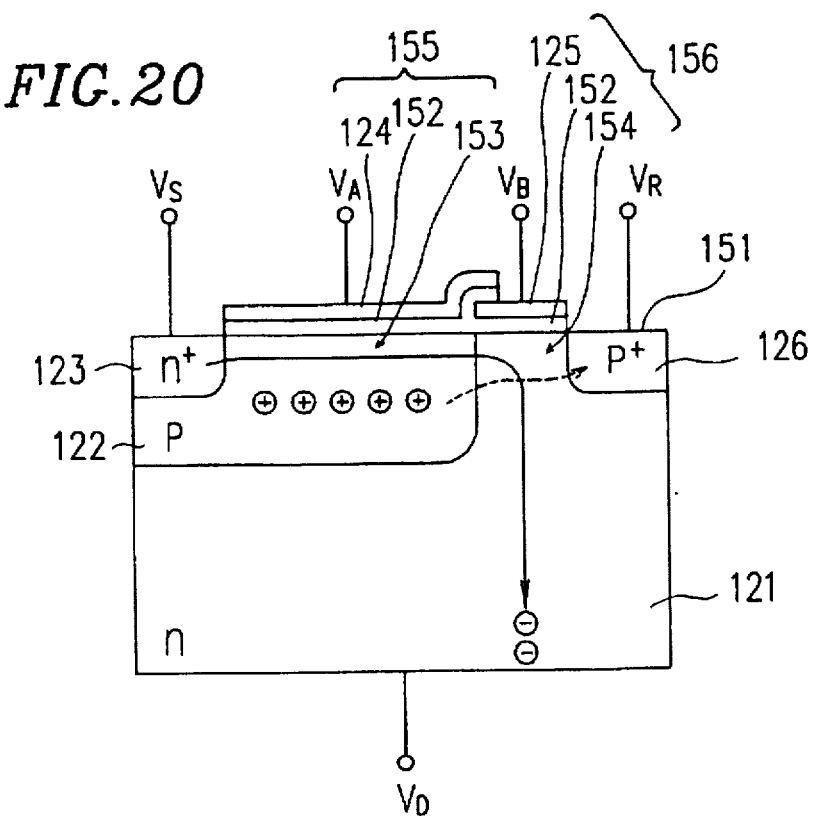

FIG. 20 is an end view of an amplifying type photoelectric converting device having an opposite polarity to that of the amplifying type photoelectric converting device shown in FIG. 1.

Figure 21A:
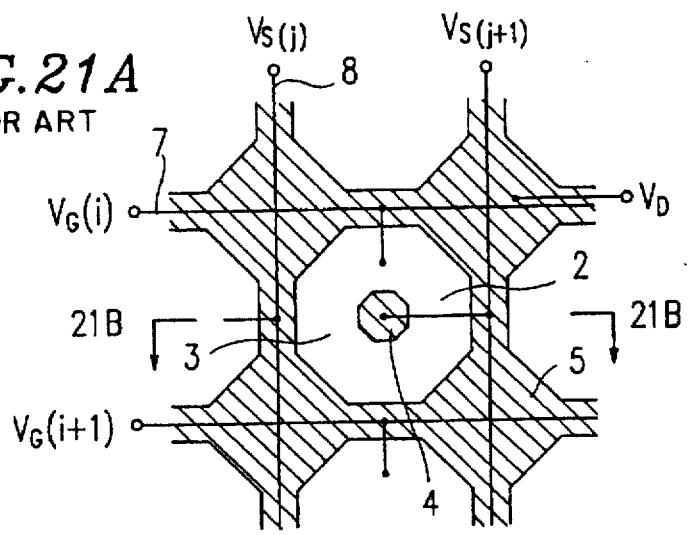

FIG. 21A is a plan view showing a conventional CMD type solid-state imaging apparatus.

12

Figure 21B:
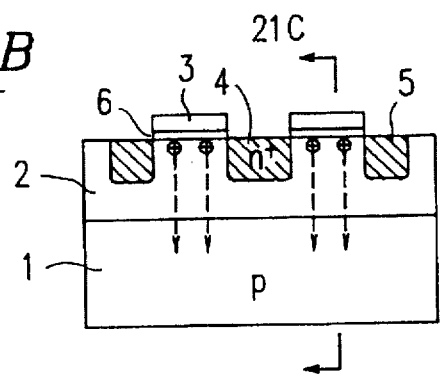

FIG. 21B is a cross sectional view of the conventional CMD type solid-state imaging apparatus.

Figure 21C:
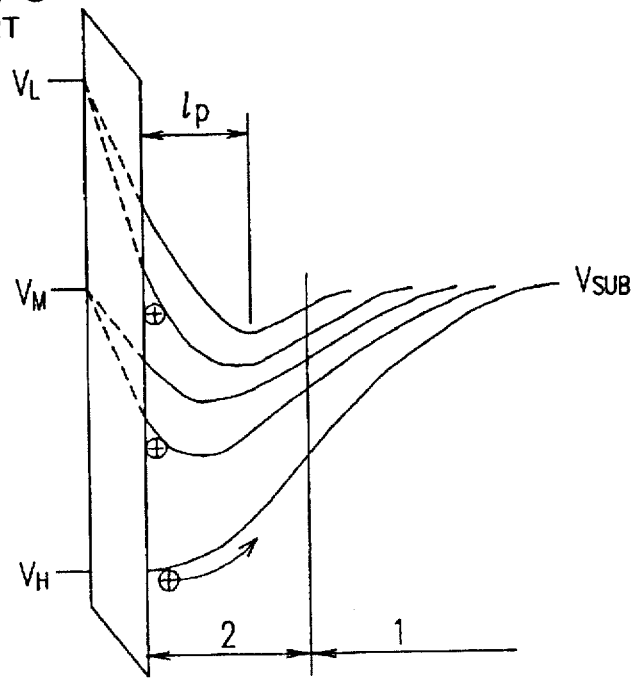

FIG. 21C shows a potential distribution in the substrate of the conventional CMD type solid-state imaging apparatus.

Figure 22A:
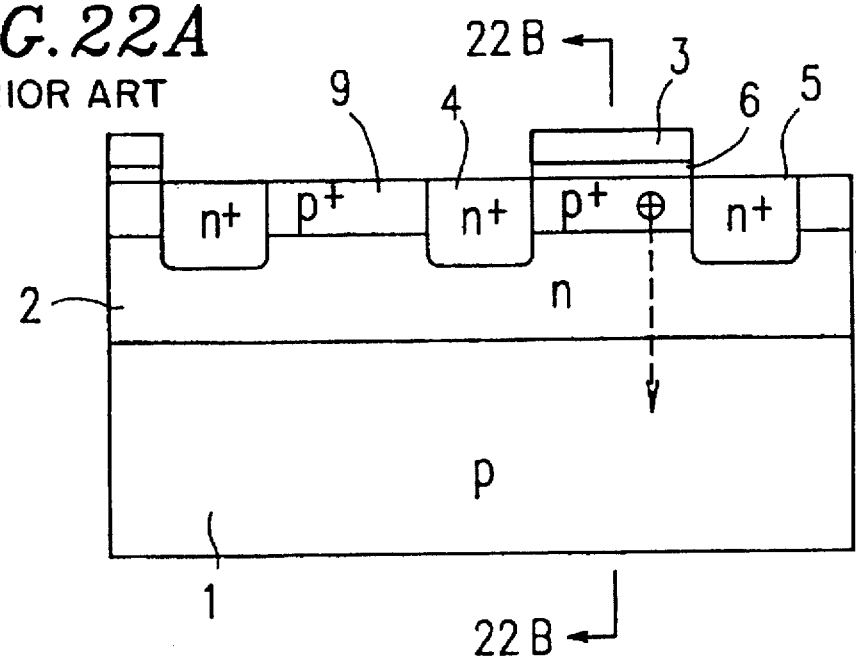

FIG. 22A is a cross sectional view of a conventional FGA type solid-state imaging apparatus.

Figure 22B:
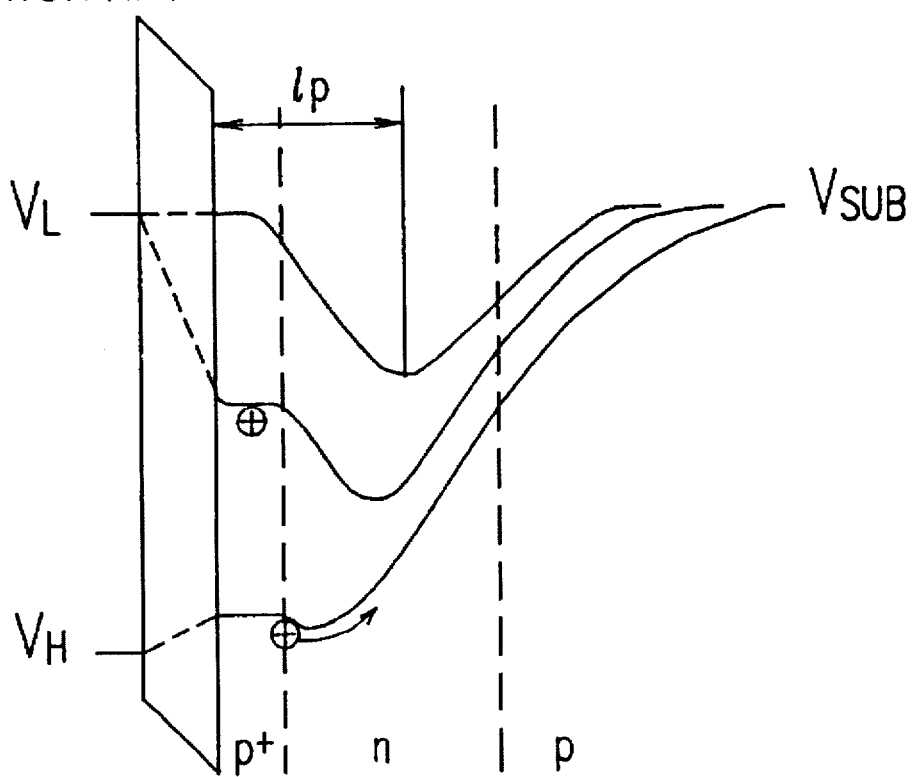

FIG. 22B shows a potential distribution in the substrate of the conventional FGA type solid-state imaging apparatus.

Figure 23A:
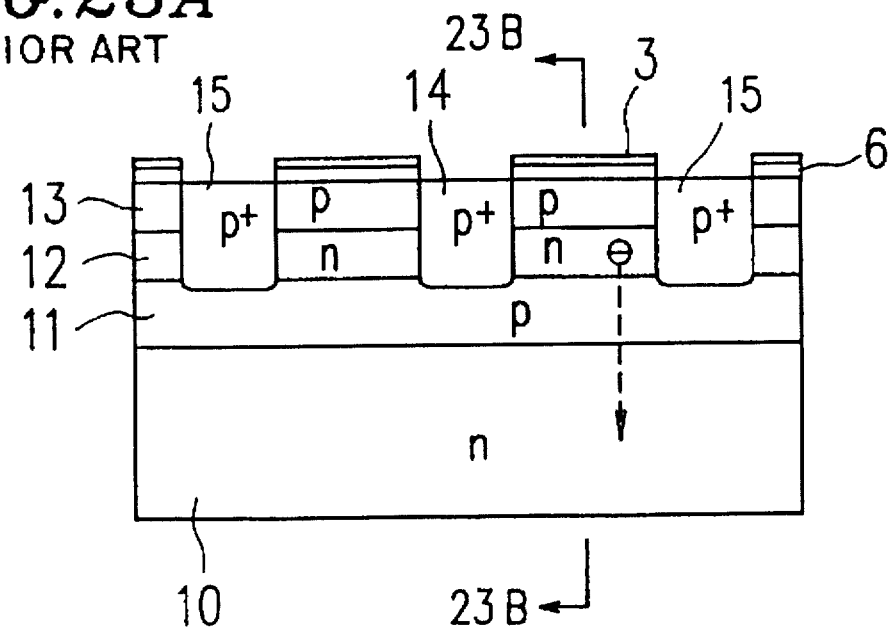

FIG. 23A is a cross sectional view of a conventional BCMD type solid-state imaging apparatus.

Figure 23B:
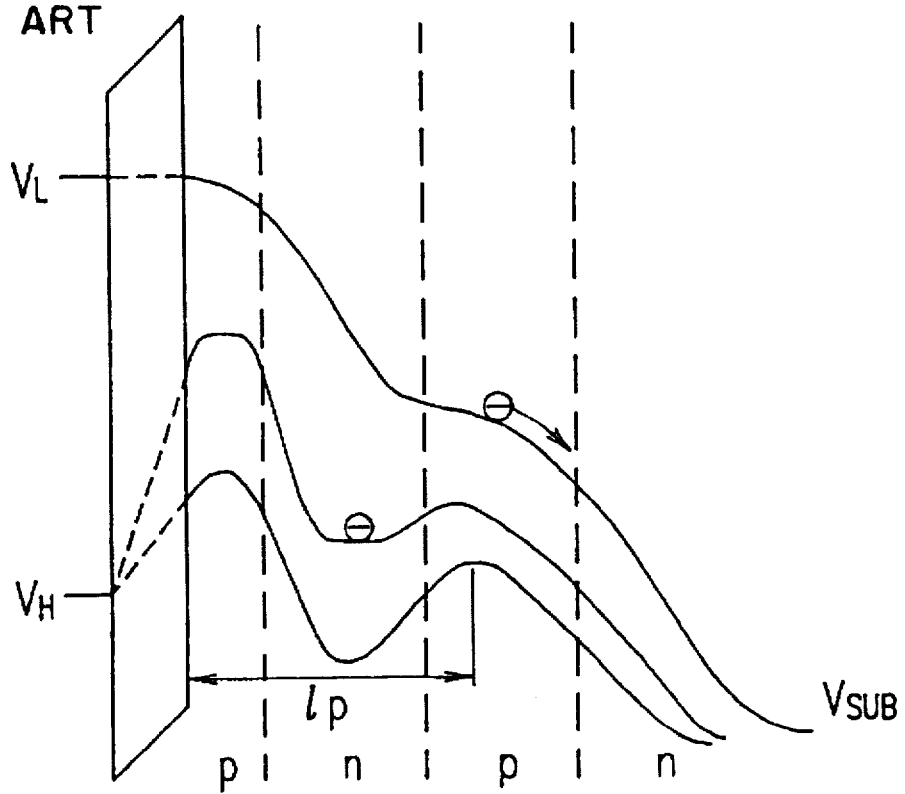

FIG. 23B shows a potential distribution in the substrate of the conventional BCMD type solid-state imaging apparatus.

Figure 24:
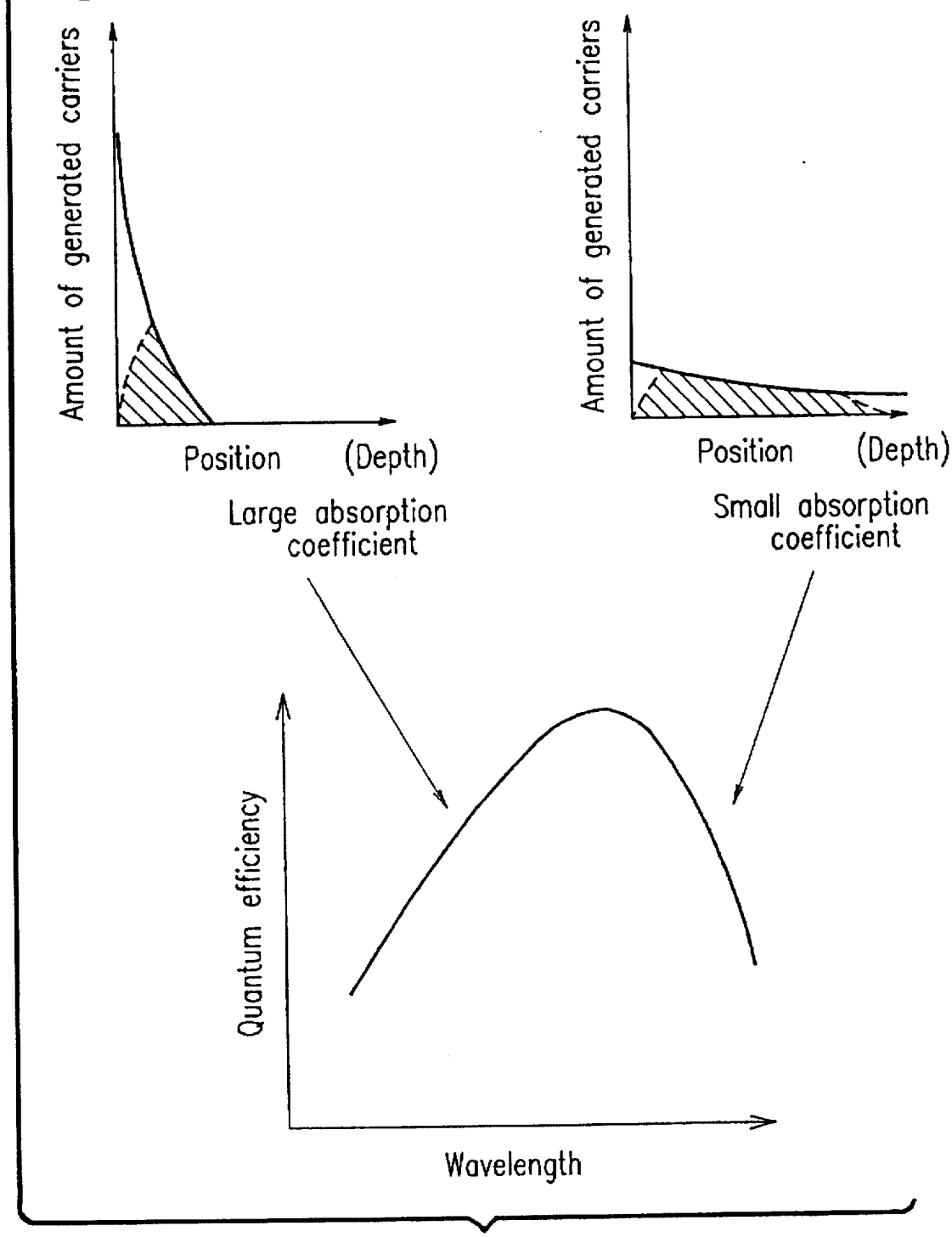

FIG. 24 shows the relationship between the amount of carriers generated when light is incident to a semiconductor and the wavelengths of the incident light, and the position in the semiconductor.

DESCRIPTION OF THE PREFERRED EMBODIMENTS

Hereinafter, the present invention will be described by way of examples with reference to the accompanying drawings.

FIG. 1 shows an example of an amplifying type photoelectric converting device according to the present invention. The portion shown in FIG. 1 corresponds one pixel of an amplifying type solid-state imaging apparatus.

An n-type well 22 is formed inside a semiconductor substrate 21 formed of a p-type semiconductor, in contact with a main surface 51 of the p-type semiconductor substrate 21. Furthermore, a p$^+$type semiconductor region 23 is formed inside the well 22, in contact with the main surface 51. A first pate electrode 24 is formed on a region excluding the semiconductor region 23 in the well 22 via an insulating film 52. A second gate electrode 25 is formed in a region adjacent to the well 22 in the substrate 21 via an insulating film 52. A surface-proximate portion 53 in the well 22 on which the insulating film 52 is provided, the insulating film 52 and the first gate electrode 24 are included in a first gate region 55. Furthermore, a surface-proximate portion 54 in the substrate 21 on which the insulating film 52 is provided, the insulating film 52 and the second gate electrode 25 are included in a second gate region 56.

A suitable voltage is applied to the first electrode 24, so that a p channel for holes which are minor carriers is formed in the surface-proximate portion 53 in the first gate region 55. Furthermore, a suitable voltage is applied to the second electrode 25, so that the entire substrate 21 located below the second electrode 25 including the surface-proximate portion 54 in the second gate region 56 formes a p channel. Therefore, a channel for allowing a current in the form of holes to flow between the substrate 21 to which a voltage $V_D$ is applied and the semiconductor region 23 to which a voltage $V_D$ is applied is formed. Accordingly, as indicated by a solid line in FIG. 1, the current flows.

When light hv penetrates the first gate electrode 24 so as to go into the semiconductor substrate 21, a pair of electron and hole is generated due to photoelectric conversion in the well 22 and the semiconductor substrate 21 which are located below the first gate electrode 24. The generated holes flow into the semiconductor region 23, while electrons are accumulated in a "potential well" formed in the middle of the well 22 so as to become signal charges, as described later. The electrons to become the signal charges are major carriers in the well 22. The accumulated signal charges vary a potential in the well 22 in accordance with an amount of the charges, and also vary a surface potential of the surface-proximate portion 53 in the first gate region 55.

Therefore, the current flowing the substrate 21 and the semiconductor region 23 is varied in accordance with the amount of the accumulated signal charges. When a constant current is allowed to flow between the substrate 21 and the semiconductor region 23, an electric potential between the substrate 21 and the semiconductor region 23 is varied in accordance with the amount of the accumulated signal charges. On the other hand, an electric potential between the substrate 21 and the semiconductor region 23 is kept constant, a current flowing between the substrate 21 and the semiconductor region 23 is varied in accordance with the amount of the accumulated signal charges. In this manner, a first active device having the surface-proximate portions 53 and 54 in the first and second gate regions 55 and 56 as a channel is formed between the substrate 21 and the semiconductor region 23. Thus, electrical characteristics are varied in accordance with the amount of the accumulated signal charges.

Furthermore, a reset drain region 26 is formed in the substrate 21, adjacent to the surface-proximate portion 54 in the second gate region 56 in the side where the first gate region 55 is not formed, in contact with the main surface 51. When a suitable voltage is applied to the second gate electrode 25, so as to lower the potential barrier of the surface-proximate portion 54 in the second gate region 56, the signal charges accumulated in the well 22 flow along the path indicated by a dotted line in FIG. 1 into the reset drain region 26. In this manner, a second active device having the surface-proximate portion 54 in the second gate region 56 as a channel is formed between the well 22 and the reset drain region 26. Thus, the signal charges are discharged.

Figure 2A:
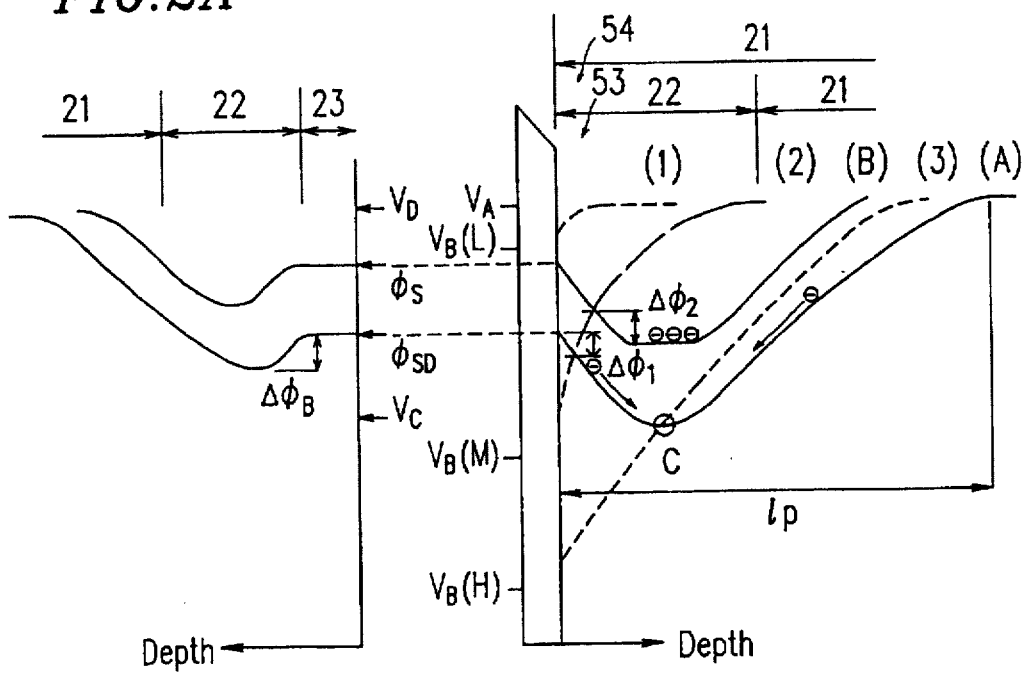
FIG. 2A shows a potential distribution in a substrate of a semiconductor at each operation of the amplifying type photoelectric converting device shown in FIG. 1.

FIG. 2A shows a potential distribution in the substrate 21 of an amplifying type photoelectric converting device shown in FIG. 1. The solid line shown in the right of FIG. 2A indicates a potential distribution in the direction of the depth below the first electrode 24 shown in FIG. 1. The broken line indicates a potential distribution in the direction of the depth below the second electrode 25 shown in FIG. 1. In the left in FIG. 2A, a potential distribution in the direction of the depth below the semiconductor region 23 shown in FIG. 1 is shown.

A constant voltage $V_A$ is applied to the first gate electrode 24. To the second electrode 25, a voltage $V_B(M)$ is applied at the time of accumulating signal charges, a voltage $V_B(L)$ is applied at the time of reading out signals, and a voltage $V_B(H)$ is applied at the time of a resetting operation.

Now, the operation of the signal charge accumulation will be described.

The incident light which has penetrated the first electrode 24 generates a pair of hole and electron in the well 22 and the substrate 21. Since absorbing coefficients are different depending on wavelengths of light, light having a short wavelength generates the pair of hole and electron in a shallow portion of the well 22, whereas light having a long wavelength reaches the internal portion of the substrate 21, where the pair of hole and electron is generated.

As shown in FIG. 2A, below the first electrode 24 is formed a potential curve (A) with respect to the electron (hereinafter, a negative potential is referred to as a large potential for electrons) in which the potential gradually decreases from the surface-proximate portion 53, hits the bottom in the middle of the well 22, and gradually increases as proceeding to the internal portion of the substrate 21. Thus, even if electrons are generated deep in the internal portion of the substrate 21, the electrons move along the potential curve (A) to a point C, which is the bottom of the potential, where the electron can be accumulated. For this reason, as shown in FIG. 2A, the optically effective depth $1_p$ reaches deep into the internal portion of the substrate 21, whereby light having a long wavelength can be sensed with high sensitivity.

When signal charges by the electrons are accumulated, the potential is raised in the portion where the electrons are accumulated. As a result, the potential curve itself is influenced by the signal charges, thus being changed to such as shown in a potential curve (B).

Figure 2B:
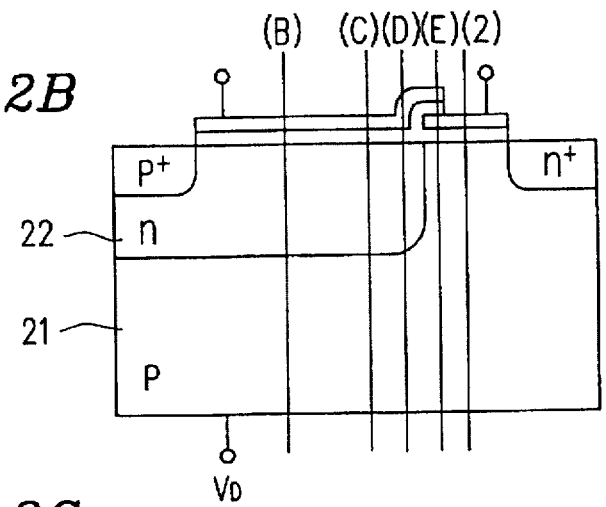
FIG. 2B is a cross sectional view of the amplifying type photoelectric converting device shown in FIG. 1.
Figure 2C:
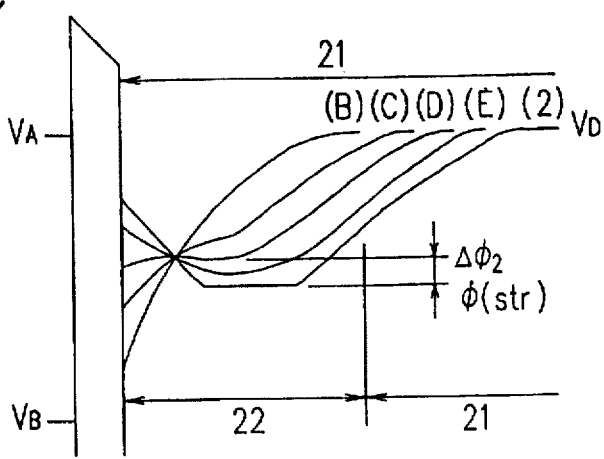
FIG. 2C shows a potential distribution at a portion in the substrate shown in FIG. 2B at the time of accumulating signal charges.

A potential distribution below the second electrode 25 is such as shown in a curve (2). FIG. 2C shows potentials in the direction of the depth in the positions shown in FIG. 2B. As apparent from FIG. 2C, the potentials moderately changes from the potential curve (2) below the second electrode 25 to the potential curve (B) where the signal charges are accumulated.

Therefore, the potential below the second electrode 25 forms a barrier more than $\Delta\phi_2$ with respect to the signal charges, thus preventing the signal charges from flowing into the reset drain region 26.

When the accumulated charges are increased, and an effective value of $\Delta\phi_2$ becomes less than a constant value (which is about 0.5 V in the case where a semiconductor is silicon, hereinafter, the case of silicon will be described), excessive charges are discharged along the potential curve (2) to the reset drain region 26. As a result, it is possible to operate an overflow operation in order to suppress blooming.

On the other hand, the potential curve (A) with respect to holes (hereinafter, a positive potential is referred to as a large potential for holes) is such that the potential gradually increases from the surface-proximate portion 53, reach the peak in the middle of the well 22, and gradually decreases as proceeding to the internal portion of the substrate 21. On the contrary, the potential curve (2) with respect to holes is such that the potential gradually decreases from the surface-proximate portion 54. In addition, in contrast with the surface potential in the surface-proximate portion 53 shown in the potential curve (A), the potential of the curve (2) in the surface-proximate portion 54 forms a barrier of $\Delta\phi_1$ with respect to holes. When the barrier is a constant value or more (>0.5 V), the holes are prevented from flowing the surface-proximate portion 53 in the first gate region 55 to the surface-proximate portion 54 in the second gate region 56.

Next, an operation of signal readout will be described.

At this time, a potential distribution below the second electrode 25 is such as shown in a curve (1). Accordingly, the potential barrier against the electrons (signal charges) accumulated below the first electrode 24 becomes much larger, thus preventing the electrons from going out, and the potential barrier against the holes disappears. Thus, a p-type channel is formed in the surface-proximate portions 53 and 54, and a current flows between the semiconductor region 23 and the substrate 21. As a result, a change in electrical characteristics between the semiconductor region 23 and the substrate 21 is sensed in accordance with the signal charges, so as to generate an output signal.

For example, in the case where setting a voltage in the substrate 21 as $V_D$, a positive voltage $V_C$ sufficiently higher than the voltage $V_D$ is applied to the semiconductor region 23 via a very small constant current load, the electrical potential of the semiconductor region 23 substantially matches a surface potential $\phi_S$ below the first electrode 24, as shown in FIG. 2A. Thus, an output signal corresponding to an amount of the signal charge can be obtained by reading out the voltage at $V_D$. Alternatively, a constant electrical potential difference is supplied between the semiconductor region 23 and the substrate 21, and a change in a current flowing between the semiconductor region 23 and the substrate 21 can be read out.

Finally, a resetting operation will be described.

At this time, a potential distribution below the second electrode 25 is such as shown in a curve (3). Since the lowest point (the point C) of the potential below the first electrode 24, at which the signal charge is nil, matches the potential below the second electrode 25 in the same depth, the barrier against the electrons disappears. As a result, the accumulated signal charges are entirely discharged along the potential curve (3) to the reset drain region 26. However, a sufficiently large potential barrier against holes is formed, a current path is not formed between the semiconductor region 23 and the substrate 21, so that current does not flow at the resetting operation. Furthermore, when the resetting operation is conducted in the middle of the period during signal accumulation, prior image data is cleared. As a result, a so-called shuttering operation in which only the data after the resetting operation is accumulated can be conducted.

As shown in FIG. 2A, a potential barrier $\Delta\phi_B$ against holes is formed below the semiconductor region 23, so that a path through which holes flow from the semiconductor region 23 through well 22 below the semiconductor region 23 to the substrate 21 is prevented from being formed.

Figure 3A:
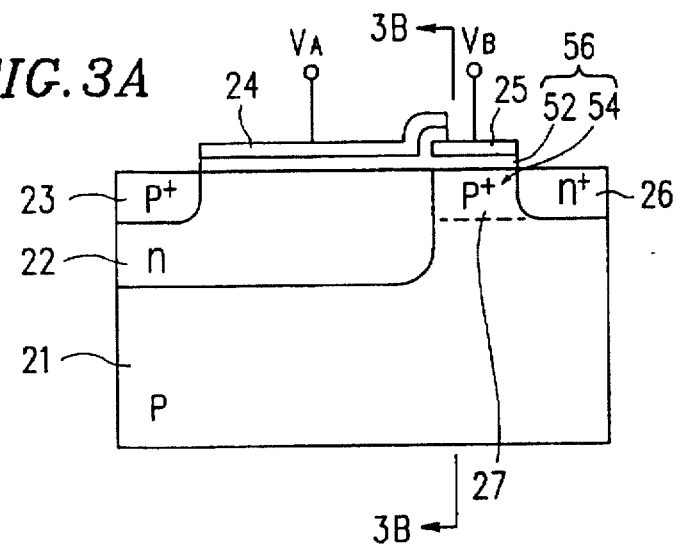
FIG. 3A is a cross sectional view of an amplifying type photoelectric converting device according to another example of the present invention.
Figure 3B:
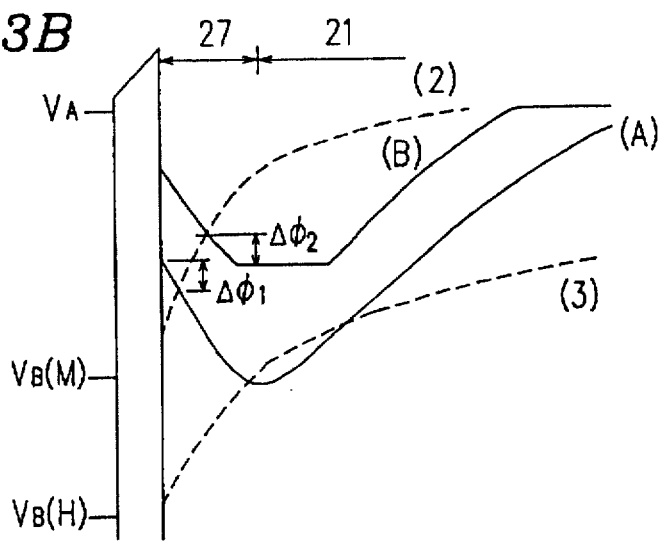
FIGS. 3B and 3C show a potential distribution in a substrate of a semiconductor at each operation of the amplifying type photoelectric converting device shown in FIG. 3A.

In FIG. 2A, at the time of accumulating signal charges, in order that the potential barrier $\Delta\phi_2$ against the signal charges (electrons) below the second electrode 25 and the potential barrier $\Delta\phi_1$ against the holes are both set at 0.5 V or more, it is desired that the potential below the second electrode 25 changes as sharply as possible at least in the proximity of the surface. On the other hand, at the time of the resetting operation, it is desired that the potential below the second electrode 25 changes as moderately as possible in order not to raise a gate voltage $V_B(H)$ of the second electrode 25. In order to meet both of the above-mentioned requirements, a concentration distribution below the second electrode 25 is preferably high in the side of the surface, and low in the deep portion. For this purpose, as shown in FIG. 3A, a p$^+$ type-first impurity layer 27 having a higher concentration of impurity than the substrate 21 can be provided in the region of the substrate 21 including the surface-proximate portion 54 in the second gate region 56. FIG. 3B shows the potential distribution below the second gate region 56 in this case. The curves (2), (3), (A) and (B) in FIG. 3B correspond to the curves (2), (3), (A) and (B) shown in FIG. 2A. As shown in the curve (2) in FIG. 3B, the potential sharply changes in the region where the first impurity layer 27 is provided, and moderately changes in the region of the substrate 21. Thus, the above-mentioned requirements are met.

Next, an operation of an amplifying type photoelectric converting device of the present invention will be described with reference to FIGS. 3A through 3C. In this case, a substrate 21 formed of a silicon semiconductor will be quantitatively discussed. Conditions are set as an example as follows:

(Condition 1)

Impurity Concentration of Substrate 21: $N_D$=5.0×10$^{14}$cm$^{-3}$.

Impurity Concentration of Well 22: $N_N$=1.0×10$^{16}$cm$^{-3}$.

Film Thickness of Well 22: $d_N$=0.84 μm.

Impurity Concentration of First Impurity Layer 27: $N_p$=1.0× 10$^{16}$cm$^{-3}$.

Film Thickness of First Impurity Layer 27: $d_p$=0.51 μm.

Film Thickness of Insulating Film 52 (below First Electrode): $d_{01}$=80 nm.

Film Thickness of Insulating Film 52 (below Second Electrode): $d_{02}$=30 nm. (1)

Driving conditions are set as follows: Where an intrinsic level of the substrate 21 is set as the reference level (0 V), and flat band voltages of the first electrode 24 and the second electrode 25 are set as 0 V for the sake of simplicity. The following driving conditions are set so that the signal accumulation operation, the readout operation and the resetting operation can be realized. In addition, a signal charge density $N_{sig}$ is set as follows:
(Condition 2)

$V_D$=0.0 V $V_A$=−0.94 V $V_B(L)$=0.0 V, $V_B(M)$=3.97 V, $V_B(H)$=9.91 V $N_{sig}$=1.95×10$^{11}$cm$^{-2}$ (2)

At this time, in view of the distribution of the intrinsic potential $\phi_i$, a barrier values $\Delta\phi_1$ and $\Delta\phi_2$ are calculated.

An impurity concentration N(x) at a depth x from the surface of the semiconductor, a potential value $\phi_i(x)$, and a depth $x_d$ of a depletion layer end satisfy the following formula. In the formula, N(x)>0 in p-type, N(x)<0 in n-type, and N(x)=0 in a neutralized region by signal accumulation.

Formula 1

$$\phi(x) = \left(\frac{q}{K_s\epsilon_0}\right)\int\int_x^{xd} N(x)dxdx \quad (3)$$

where q is an amount of an electron charge, $k_s$ is a relative dielectric constant of a semiconductor, and $\epsilon_0$ is a dielectric constant in vaccum.

Figure 3C:
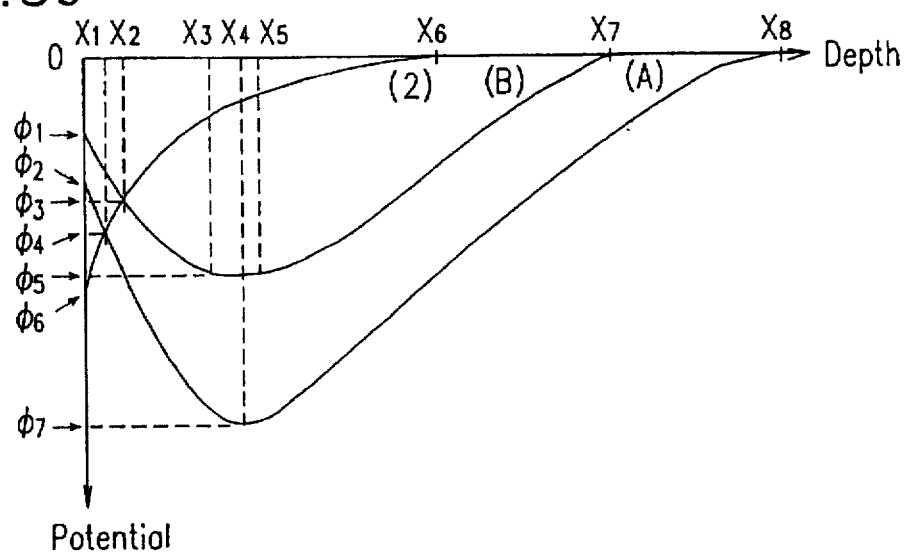

FIG. 3C shows potential distributions in the direction of the depth below the first electrode 24 indicated by the curves (A) and (B), and a potential distribution in the direction of the depth below electrode 25 indicated by the curve (2). When a position and a potential value $\phi_j$ of each portion are set as shown in FIG. 3C, calculation is conducted in accordance with the formula (3), the following values are obtained, and $\phi_j$ indicate values having units of μm and V, respectively.)
(Results 4)

$x_1$=0.088, $x_2$=0.149, $x_3$=0.509, $x_4$=0.664, $x_5$=0.703, $x_6$=1.797, $x_7$=3.558, $x_8$=4.349, $\phi_1$=1.000, $\phi_2$=1.592, $\phi_3$=2.000, $\phi_4$=2.432, $\phi_5$=3.000, $\phi_6$=3.149, $\phi_7$=5.000, (4)

The following results can be further obtained from the above results.
(Results 5)

$\Delta\phi_1$=$\phi_4$−$\phi_2$=0.84 V $\Delta\phi_2$=$\phi_5$−$\phi_3$=1.00 V (5)

These values, which are 0.5 V or more, are sufficient to form a potential barrier, as described above. Moreover, the potential curves (A) and (B) reach the depths of 4.3 μpm and 3.6 μpm, respectively. These values correspondd to an optically effective depth $l_p$. Generally, since a depth of at least 2 μm is sufficient to sense light having a long wavelength among visible light, these values show that light having a long wavelength can be sensed with a sufficient sensitivity. It is necessary that a reset drain voltage $V_R$ is higher than $\phi_7$, and about the following value in the intrinsic level.

$$V_R = 6.0 \text{ V} \tag{6}$$

These driving voltages can be easily changed when the conditions such as impurity concentration and thickness of the semiconductor layer are changed.

In the above-mentioned amplifying type photoelectric converting device according to an example of the present invention, electrons are accumulated in the well 22 in the substrate 21 as signal charges. As a result, the deeper portion of the substrates 21 is neutralized. The electrons generated by photoelectric conversion in the neutralized region reach the end of the depletion layer by diffusion, and are then added to the signal charges in the well 22. Thus, the resolution is deteriorated due to the influence by adjacent pixels.

In order to solve this problem, as shown in FIG. 4A, a second impurity layer 28 having a higher impurity concentration ($N_B$) than the substrate 21 (concentration $N_D$) can be formed in at least in the region below the first gate electrode 24, and preferably in the region below the entire well 22, the second gate electrode 25 and the reset drain region 26. FIG. 4B shows a potential distribution below the gate electrode 24 and an impurity concentration.

By providing the second impurity layer 28, a potential barrier $\Delta\phi_B$ is formed in accordance with the following equation. As a result, the electrons generated by photoelectric conversion in the neutralized region in the substrate 21 are shielded by the potential barrier $\Delta\phi_b$, so as to move to the bottom of the potential. Accordingly, the electron are not accumulated as signal charges for adjacent pixels, thus preventing the resolution from deteriorating.

$$\Delta\phi_B = (kT/q) \cdot \ln(N_B/N_D) \tag{7}$$

where k is a Boltzmann's constant, T is an absolute temperature.

FIGS. 5A through 5C show an example of a two dimensional image sensor using the amplifying type photoelectric converting device shown in FIG. 1, 3A through 3C, or 4A and 4B. In the two dimensional image sensor, the amplifying photoelectric converting device is used as one pixel, and arranged in the plurality in an X direction and a Y direction. FIG. 5A is a plan view of the two dimensional image sensor. FIGS. 5B and 5C show cross sections taken at the lines 5B×5B, and 5C×5C shown in FIG. 5A, respectively.

In the amplifying type photoelectric converting device functioning as each pixel of the two dimensional image sensor, a plurality of n-type wells 22 are formed in a p-type semiconductor substrate 21 in contact with the main surface 51 of the substrate 21. A $p^+$-type semiconductor region 23 is formed in each well 22 in contact with the main surface 51. A first gate electrode 24 is formed via an insulating film 52 so as to cover the region excluding the semiconductor region 23 in the well 22. Furthermore, a second gate electrode 25 is formed via the insulating film 52 on the substrate 21 adjacent to the well 22. Furthermore, a reset drain region 26 is provided inside the substrate 21 so as to be adjacent to a surface-proximate portion 54. A surface-proximate portion 53 in the well 22 on which the insulating film 52 is provided, the insulating film 52 and the first gate electrode 24 are included in a first gate region 55. Furthermore, a surface-proximate portion 54 in the substrate 21 on which the insulating film 52 is provided, the insulating film 52 and the second gate electrode 25 are included in a second gate region 56.

In the two dimensional image sensor, the first gate electrodes 24 and the second gate electrodes 25 of each amplifying type photoelectric converting device are connected to each other in the Y direction, and extend in the Y direction so as to form stripe shapes. The reset drain regions 26 are connected to each other in the Y direction, and extend in the Y direction so as to form stripe shapes. As shown in FIGS. 5B and 5C, the surface-proximate portion 54 surrounds each well 22, and thereby physically separating the well 22 from the adjacent wells 22. Furthermore, a voltage applied to the second gate electrode 25 provided above the surface-proximate portion 54 is controlled so as to separate pixels.

The first gate electrodes 24 indicated by a dash-dot line in FIG. 5A are commonly connected to a DC power source 36, which is indicated by $V_A$. The second gate electrodes 25 indicated by a solid line are commonly connected in the Y direction to clock lines 37, which are indicated by $V_B(i)$, $V_B(i+1)$, and the like. The reset drain regions 26 indicated by cross-hatching are commonly connected to a DC power source 35, which is indicated by $V_R$. The semiconductors 23 indicated by hatching are commonly connected in the X direction to signal lines 34, which are indicated by $V_S(j)$, $V_S(j+1)$, and the like. In the signal lines 34, a change in the surface potential of the surface-proximate portions 53 in the first gate regions 55 surrounding the semiconductor regions 23 in each pixel is sensed as an electrical potential change in the semiconductor regions By such a structure, a two dimensional image sensor using the amplifying type photoelectric converting device shown in FIG. 1 and other figures can be realized in a simple structure. In particular, since the two dimensional image sensor can be operated by applying a DC voltage commonly to the first gate electrode 24 in each pixel, it is unnecessary to take dullness or delay of a clock waveform caused by the resistance of electrodes themselves into consideration, which otherwise cause a problem in the case where clock signals are supplied. Thus, it is possible, by reducing the thickness of the first gate electrode 24, to increase the amount of the light incident to the well 22 and the substrate 21 and thus improve the sensitivity for reception of light.

In the amplifying type photoelectric converting device functioning as each pixel of the two dimensional image sensor shown in FIGS. 5A through 5C, the first impurity layer 27 shown in FIG. 3A or the second impurity layer 28 shown in FIG. 4A can be further provided.

FIGS. 6A and 6B show another example of a two dimensional image sensor using the amplifying type photoelectric converting device shown in FIG. 1, 3A through 3C, or 4A and 4B. In the two dimensional image sensor, the amplifying photoelectric converting device is used as one pixel, and arranged in the plurality in an X direction and a Y direction. The two dimensional image sensor shown in FIGS. 6A and 6B includes pixels each formed of an octagonal unit. FIG. 6A is a plan view of the two dimensional image sensor. FIG. 6B shows a cross section taken at the line 6B–6B shown in FIG. 6A.

In the amplifying type photoelectric converting device functioning as each pixel of the two dimensional image sensor, octagonal n-type wells 22 are formed in a substrate 21 formed of a p-type semiconductor in contact with the main surface 51 of the p-type semiconductor substrate 21. A p+-type semiconductor region 23 is formed in each well 22 in contact with the main surface 51. A first gate electrode 24 is formed via an insulating film 52 so as to cover the region excluding the semiconductor region 23 in the well 22. Furthermore, a second gate electrode 25 or 29 is formed via the insulating film 52 on the substrate 21 adjacent to the well 22. A surface-proximate portion 53 in the well 22 on which the insulating film 52 is provided, the insulating film 52 and the first gate electrode 24 are included in a first gate region 55. Furthermore, a surface-proximate portion 54 in the substrate 21 on which the insulating film 52 is provided, the insulating film 52 and the second gate electrode 25 or 29 are included in a second gate region 56.

In the two dimensional image sensor, the first gate electrodes 24 and the second gate electrodes 25 and 29 of each amplifying type photoelectric converting device are connected to each other in the Y direction, and extend in the Y direction so as to form stripe shapes. Furthermore, the second gate electrode 25 partially overlaps the second gate electrode 29 of the pixel adjacent in the X direction via the insulating film 52. As shown in FIGS. 6A and 6B, the surface-proximate portion 54 surrounds each well 22, and thereby physically separating the well 22 from the adjacent wells 22. Furthermore, a voltage applied to the second gate electrodes 25 and 29 provided above the surface-proximate portion 54 is controlled so as to separate pixels.

Between four adjacent wells 22 in the X and Y directions, a reset drain region 26 of an island shape is provided inside the substrate 21 so as to be surrounded by the surface-proximate portion 54. By such a structure, since it is possible to increase a relative area ratio of the first gate electrode 24 contributing to photoelectric conversion in the pixel, the sensitivity for reception of light can be enhanced.

The first gate electrodes 24 indicated by a dash-dot line in FIG. 6A are commonly connected to a DC power source 36, which is indicated by $V_A$. The second gate electrodes 25 indicated by a broken line and the second gate electrodes 29 indicated by a solid line are commonly connected in the Y direction to clock lines 37, which are indicated by $V_B(i)$, $V_B(i+1)$, and so forth. The reset drain regions 26 indicated by cross-hatching are commonly connected to a DC power source 35, which is indicated by $V_R$. The semiconductors 23 indicated by hatching are commonly connected in the X direction to signal lines 34, which are indicated by $V_S(j)$, $V_S(j+1)$, and so forth. In the signal lines 34, a change in the surface potential of the surface-proximate portions 53 in the first gate regions 55 surrounding the semiconductor regions 23 in each pixel is sensed as an electrical potential change in the semiconductor regions 23. By such a structure, a two dimensional image sensor using the amplifying type photoelectric converting device shown in FIG. 1 and other figures can be realized in a simple structure.

In the amplifying type photoelectric converting device functioning as each pixel of the two dimensional image sensor shown in FIGS. 6A through 6C, the first impurity layer 27 shown in FIG. 3A or the second impurity layer 28 shown in FIG. 4A can be further provided.

FIG. 7 shows a circuit configuration for driving the two dimensional image sensors shown in FIGS. 5A through 5C, and 6A and 6B.

The clock lines 36 connecting the first gate electrodes 24 are commonly connected to the DC power source $V_A$. Moreover, the clock lines 37 connecting the second gate electrodes 25 are connected to vertical scanning circuits 40 by every line. Furthermore, each vertical signal line 34 is connected to a common signal line ($V_O$) 43 via an MOSFET 46. After a constant current load 44 is connected to the common signal line 43, an signal OS is output to the common signal line 43 via a buffer amplifier 45. A scanning signal from a horizontal scanning circuit 42 is supplied to a gage of each MOSFET 46.

As shown in FIG. 7, each amplifying type photoelectric converting device including a first active device 60 and a second active device 61. The first active device 60 is represented by an equivalent circuit including the first gate electrode 24, a transistor and the second gate electrode 25, and another transistor connected to the substrate 21 as indicated by $V_D$. The transistor and the second gate electrode 25 function as a photoelectric converting device. The second active device 61 is represented by an equivalent circuit including the second gate electrode 25, and a transistor connected to the reset drain region 26 as indicated by $V_R$. Since the second gate electrode 25 is shared by the two transistors, it is drawn in the manner shown in FIG. 7.

FIGS. 8A through 8D each shows an example of a timing of each signal supplied to the driving circuit of the two dimensional image sensor shown in FIG. 7. Herein, $V_B(i)$ represents the (i)th horizontal clock line to which a voltage $V_B$ is supplied.

Figure 8A:
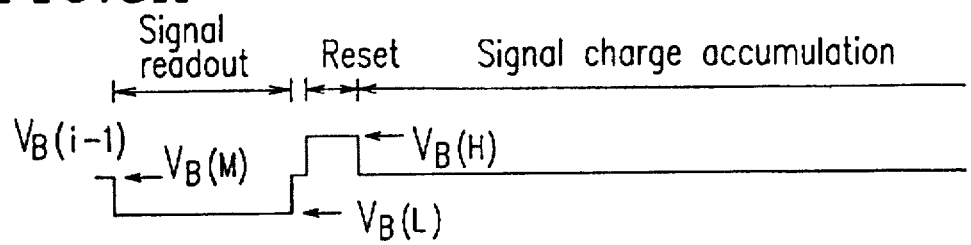
Figure 8B:
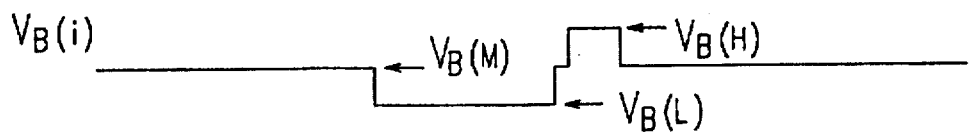
Figure 8C:
Figure 8D:
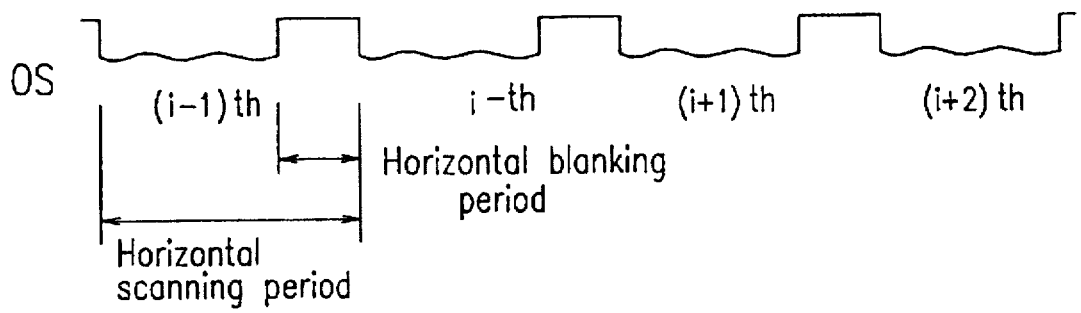

First, in the (i−1)th horizontal scanning period, the (i−1)th horizontal clock line is in a readout operation. By applying a voltage $V_B(L)$ to a clock line V.(i−1) as shown in FIG. 8A, a signal for a pixel of a horizontal (i−1)th line can be obtained as an output signal OS as shown in FIG. 8D. In the next horizontal blanking period, a resetting operation starts. A voltage $V_B(H)$ is applied to the clock line $V_B(i−1)$, so as to reset the signal for the pixel of the horizontal (i−1)th line. After the resetting operation, a voltage $V_B(M)$ is applied to the clock line $V_B(i−1)$, so that a signal accumulating operation starts. Thereafter, in the same manner as shown in FIGS. 8B through 8D, each operation of reading out, reset and accumulating signals for pixels on the next horizontal line is sequentially conducted.

FIGS. 9A through 9C show an example of timings of a signal for realizing a shuttering operation.

As shown in FIG. 9A, in the clock line $V_B(i−1)$, a period from the time when the voltage $V_B(L)$ is applied so as to read out a signal to the time when another voltage $V_B(L)$ is applied so as to read out the next signal is a vertical scanning period. Generally, immediately after the voltage $V_B(L)$ is applied so as to read out a signal, a voltage $V_B(H)$ is applied so as to reset accumulated signal charges. However, by shortening the time lag between the timing for applying the voltage $V_B(H)$ and the timing for applying the next voltage $V_B(L)$ for reading out the next signal, as indicated by dashed line, a period during which accumulation of effective signals can be shortened, whereby the shuttering operation can be realized.

In the amplifying type photoelectric converting device and the amplifying type solid-state imaging apparatus of the present invention, a dark current can be suppressed. A driving method for suppressing the dark current will be described by way of the two dimensional image sensor shown in FIGS. 5A through 5C, or FIGS. 6A and 6B, with reference to FIGS. 10A and 10B.

FIG. 10A is a cross sectional view of the amplifying type photoelectric converting device of the present invention. States at the time of reading out signals and at the time of accumulating signals are shown on the right and the left of FIG. 10A, respectively. FIG. 10B shows potential distributions at the time of reading out signals and at the time of accumulating signals on the right and on the left, respectively. The potential distribution below the first electrode 24 is represented by a solid line, and that below the second electrode 25 is represented by a broken line. In FIG. 10A, the semiconductor region 23 is commonly connected to a power source $V_C$ via a constant current load.

In a pixel at the time of reading out signals, a voltage $V_A$ is applied to the first gate electrode 24, and a voltage $V_B(L)$ is applied to the second gate electrode 25. As a result, a p-type channel between the semiconductor region 23 and the substrate 21 is formed in the surface-proximate portion 53 below the first gate electrode 24 and the surface-proximate portion 54 below the second gate electrode 25. An electrical potential of the semiconductor region 23 matches a surface potential value $V_S$ below the first gate electrode 24.

On the other hand, in the pixel at the time of accumulating signals, since a voltage $V_B(M)$ is applied to the second gate electrode 25, a potential working as a barrier against holes is formed in the surface-proximate portion 54 below the second gate electrode 25. Herein, in order that a surface potential of the surface-proximate portion 53 below the first gate electrode 24 is made lower than the electrical potential supplied to the semiconductor region 23, a voltage $V_A'$ which is lower than the voltage $V_A$ is applied to the first gate electrode 24. Then, holes are supplied from source lines $V_S$ commonly connected, so as to be accumulated in the surface-proximate portion 53. Thus, during most of time when signals are being accumulated, the surface-proximate portion 53 corresponding to a photoelectric conversion region is filled with the holes, thereby considerably suppressing the generation of the dark current.

The value of $V_A'$ is determined in the following manner in the case of the aforementioned Condition 1 and Condition 2.

In the pixel at the time of reading out signals, the surface potential $V_S$ becomes shallower as more signal charges (electrons) exist. Accordingly, the surface potential $V_S$ is obtained by using the results 4 as follows:

$$V_S(min.) = \phi_1 1.000 \ V$$

In the case where the surface potential is fixed to be $V_S$ (min.), when no signal change (electron) is accumulated during an signal accumulating operation, an amount of hole accumulation $N_h$ (per unit area) in the surface-proximate portion 53 is minimized. Accordingly, the electric potential $V_A'$, by which sufficient value of $N_h$ can be obtained even if no signal charge is accumulated, is obtained in accordance with the following formula, where $C_0$ is a capacitance per unit area of a gate insulating film, and other references are defined above.

[Formula 2]

$$V_A = V_S(min) - \left(\frac{q}{C_0}\right) \cdot \left(\int_0^{xd} N(x)dx + N_h\right) \quad (8)$$

When $N_h = 1 \times 10^{11} cm^{-2}$, for example, $$V_A = -1.945 \ V, \quad (9)$$

which is a voltage lower that $V_A$ by about 1 V.

FIG. 11 shows a circuit necessary for suppressing the dark current by the above-mentioned method. A vertical scanning circuit 41 is further provided in the circuit shown in FIG. 7. The first gate electrode 24, which is connected to the DC power source $V_A$ in FIG. 7, is connected to the vertical scanning circuit 41 by every horizontal line via clock lines $V_A(i)$, $V_A(i+1)$ and the like. The vertical scanning circuit 41 applies the voltage $V_A$ to each clock line at the time of reading out signals, and the voltage $V_A'$ at the time of accumulating signals. In this way, different electric potentials between horizontal lines can be supplied from the vertical scanning circuit 41 via the clock lines to the first gate electrode 24. Therefore, it is possible to supply an electric potential for suppressing the dark current to a certain horizontal line at the time of accumulating signals.

FIGS. 12A through 12G show an example of timings of each signal supplied to the driving circuit of the two dimensional image sensor shown in FIG. 11.

During the (i–1)th horizontal scanning period, at the time of reading out signals, the voltage $V_A$ is applied only to the clock line $V_A(i-1)$, and the voltage $V_A'$ is maintained for other clock lines $V_A(k)$ ($k \neq i-1$). By applying the voltage $V_A$ only during reading out signals, holes for suppressing the dark current are constantly injected during the period except the time of reading out signals. At this time, in order to prevent the holes injected for the purpose of suppressing the dark current from influencing the signal for the pixel on the horizontal (i–1)th line, the voltage $V_A$ is preferably applied to the clock line $V_A(i-1)$ immediately before the signal readout operation starts, so as to remove the holes for suppressing the dark current. Then, after the period during which signals are read out, the voltage $V_A'$ is preferably applied to the clock line $V_A(i-1)$ so as to inject the holes for suppressing the dark current.

In the amplifying type photoelectric converting device and the amplifying type solid-state imaging apparatus of the present invention described above, the second gate region 56 has functions both of controlling a current in the form of holes flowing between the semiconductor region 23 and the controlling 21, and of controlling the discharge of signal charges by electrons accumulated in the well 22 to the reset drain region 26, as shown in FIG. 1. However, it is possible to allow discrete gate regions to have each of these functions. Such a case will be described below.

FIG. 13 shows another example of the amplifying type photoelectric converting device of the present invention, which corresponds to one pixel of the amplifying type solid-state imaging apparatus.

N-type wells 22 are formed in a substrate 21 formed of a p-type semiconductor in contact with the main surface 51 of the p-type semiconductor substrate 21. A p+-type semiconductor region 23 is formed in each well 22 in contact with the main surface 51. A first gate electrode 24 is formed via an insulating film 52 on a part of the region excluding the semiconductor region 23 in the well 22. Furthermore, a second gate electrode 25-1 is formed via the insulating film 52 on the substrate 21 adjacent to the well 22. A surface-proximate portion 53 in the well 22 on which the insulating film 52 is provided, the insulating film 52 and the first gate electrode 24 are included in a first gate region 55. Furthermore, a surface-proximate portion 70 in the substrate 21 on which the insulating film 52 is provided, the insulating film 52 and the second gate electrode 25-1 are included in a second gate region 71.

Furthermore, a third gate region 73 is provided adjacent to the first gate region 55. The third gate region 73 includes a surface-proximate portion 72, an insulating film 52 and a third gate electrode 25-2. The surface-proximate portion 72 is adjacent to the surface-proximate portion 53 in the well 22. The insulating film is provided on the surface-proximate portion 72. The third gate electrode 25-2 is provided above the surface-proximate portion 72 via the insulating film 52, adjacent to the first gate electrode 24. Furthermore, a reset drain region 26 is provided inside the substrate 21 adjacent to the third gate region 73 and in contact with the main surface 51.

As described above with reference to FIG. 1, a first active device having the surface-proximate portions 53 and 70 in the first gate region 55 and the second gate region 71 as a channel is formed between the substrate 21 and the semiconductor region 23. Thus, the electric characteristics of the active device are changed in accordance with the accumulated signal charges. On the other hand, a third active device having an internal portion of the well 22 as a channel is formed between the well 22 and the reset drain region 26. Thus, the signal charges are discharged. Accordingly, the second gate region 71 has a function of controlling the current by holes flowing between the semiconductor region 23 and the substrate 21, while the third gate region 73 has a function of controlling the discharge of the signal charges by electrons accumulated in the well 22 to the reset drain region 26.

FIGS. 14A, 14B, and 14C show potential distributions in the substrate 21 at the time of accumulating signals, reading out signals and a resetting operation in the amplifying type photoelectric converting device shown in FIG. 13, respectively. A solid line, a broken line and a dash-dot line in FIGS. 14A, 14B and 14C indicate the potential distributions below the first gate electrode 24, the second gate electrode 25-1 and the third gate electrode 25-2, respectively. Furthermore, a constant DC voltage $V_A$ is applied to the first gate electrode 24 during any operations.

When the signal charges do not exist in the well 22, for example, immediately after a resetting operation, a potential represented by a curve (A) is formed. When the signal charges are accumulated in the maximum quantity, a potential represented by a curve (B) is formed.

At the time of accumulating signals, voltages $V_B(H)$ and $V_E(L)$ are applied to the second gate electrode 25-1 and the third gate electrode 25-2, respectively. As a result, potential distributions represented by curves (D) and (C) in FIG. 14A are formed below the second gate electrode 25-1 and the third gate electrode 25-2. As shown in FIG. 14A, in contrast with the potential barrier below the first gate electrode 24, the potential barrier having more than $\Delta\phi_4$ with respect to holes is formed below the second gate electrode 25-1. The potential barrier having $\Delta\phi_2$ with respect to electrons is formed below the second gate electrode 25-1. For this reason, a current in the form of the holes does not flow between the semiconductor region 23 and the substrate 21.

Furthermore, in contrast with the potential barrier below the first gate electrode 24, the potential barrier having $\Delta\phi_3$ with respect to electrons is formed below the third gate electrode 25-2. Thus, the accumulated signal charges do not flow out. However, when the signal charges are excessively accumulated, and the potential barrier $\Delta\phi_3$ becomes 0.5 V or less, the excessive charges are discharged to the reset drain region 26. At this time, a minimal value of $\Delta\phi_3$ is preferably larger than a minimal value of $\Delta\phi_2$.

At the time of reading out signals, voltages $V_B(L)$ and $V_E(L)$ are applied to the second gate electrode 25-1 and the third gate electrode 25-2, respectively. The voltage $V_E(L)$ to be applied to the third gate electrode 25-2 is not necessarily the same voltage as at the time of accumulating signals. As a result, potential distributions represented by curves (D) and (C) in FIG. 14B are formed below the second gate electrode 251 and the third gate electrode 25-2. As shown in FIG. 14B, the potential margin with respect to holes below the second gate electrode 25-1 is $\Delta\phi_5$, in contrast with below the first gate electrode 24. For this reason, a current in the form of the holes flows between the semiconductor region 23 and the substrate 21. Thus, a change in electrical characteristics between the semiconductor region 23 and the substrate 21 is sensed in accordance with an amount of the accumulated signal charges.

At the time of a resetting operation, voltages $V_B(H)$ and $V_E(H)$ are applied to the second gate electrode 25-1 and the third gate electrode 25-2, respectively. The voltage $V_B(H)$ to be applied to the second gate electrode 25-1 is not necessarily the same voltage as at the time of accumulating signals. As a result, potential distributions represented by curves (D) and (C) in FIG. 14C are formed below the second gate electrode 25 and the third gate electrode 25-2. As shown FIG. 14C, the potential margin with respect to electrons below the third gate electrode 25-2 is $\Delta\phi_6$, in contrast with below the first gate electrode 24. Thus, the accumulated signal charges are entirely discharged to the reset drain region 26.

FIGS. 15A through 15C show another example of a two dimensional image sensor using the amplifying type photoelectric converting device shown in FIG. 13. In the two dimensional image sensor, the amplifying type photoelectric converting device is used as one pixel, and arranged in the plurality in an X direction and a Y direction. FIG. 15A is a plan view of the two dimensional image sensor. FIGS. 15B and 15C show cross sections taken at the lines 15B—15B and 15C—15C shown in FIG. 15A.

The amplifying type photoelectric converting device functioning as a pixel of the two dimensional image sensor has the same structure as shown in FIG. 13. In the two dimensional image sensor, the first gate electrodes 24, the second gate electrodes 25-1 and the third gate electrodes 25-2 of each amplifying type photoelectric converting device are connected to each other in the Y direction, and extend in the Y direction so as to form stripe shapes. The reset drain regions 26 are connected to each other in the Y direction, and extend in the Y direction so as to form stripe shapes. As shown in FIGS. 15B and 15C, each well 22 is surrounded by the surface-proximate portion 70 and the drain region 26, and thereby physically being separated from the adjacent wells 22. Furthermore, a voltage applied to the second gate electrode 25-1 provided above the surface-proximate portion 70 is controlled so as to separate pixels.

The first gate electrodes 24 indicated by a dash-dot line in FIG. 15A are commonly connected to a DC power source 36, which is indicated by $V_A$. The second gate electrodes 25-1 indicated by a broken line and the third gate electrodes 25-2 indicated by a solid line are commonly connected in the Y direction to clock lines 37 and 38, which are indicated by $V_B(i)$, $V_B(i+1)$, and $V_E(i)$, $V_E(i+1)$, and so forth. The reset drain regions 26 indicated by cross-hatching are commonly connected to a DC power source 35, which is indicated by $V_R$. The semiconductors 23 indicated by hatching are commonly connected in the X direction to signal lines 34, which are indicated by $V_S(j)$, $V_S(j+1)$, and the like.

FIGS. 16A and 16B show another example of a two dimensional image sensor using the amplifying type photoelectric converting device shown in FIG. 13. In the two dimensional image sensor, the amplifying type photoelectric converting device is used as one pixel, and arranged in the plurality in an X direction and a Y direction. The two dimensional image sensor shown in FIGS. 16A and 16B includes pixels each formed of an octagonal unit. FIG. 16A is a plan view of the two dimensional image sensor. FIG. 16B shows a cross section taken at the line 16B—16B shown in FIG. 16A.

The amplifying type photoelectric converting device functioning as a pixel of the two dimensional image sensor has the same structure as shown in FIG. 13. In the two dimensional image sensor, the first gate electrodes 24, the second gate electrodes 25-1 and the third gate electrodes 25-2 of each amplifying type photoelectric converting device are connected to each other in the Y direction, and extend in the Y direction so as to form stripe shapes. Furthermore, the second gate electrode 25-1 partially overlaps the third gate electrode 25-2 of the pixel adjacent in the X direction via the insulating film 52. As shown in FIGS. 16A and 16B, each well 22 is surrounded by the surface-proximate portion 70 and the drain region 26, and thereby physically being separated from the adjacent wells 22. Furthermore, a voltage applied to the second gate electrode 25-1 provided above the surface-proximate portion 70 is controlled so as to separate pixels.

Between four adjacent wells 22 in the X and Y directions, the reset drain region 26 of an island shape is provided inside the substrate 21 so as to be surrounded by the surface-proximate portion 70. By such a structure, since it is possible to increase a relative area ratio of the first gate electrode 24 contributing to photoelectric conversion in the pixel, the sensitivity for reception of light can be enhanced.

The first gate electrodes 24 indicated by a dash-dot line in FIG. 16A are all commonly connected to a DC power source 36, which is indicated by $V_A$. The second gate electrodes 25-1 indicated by a broken line and the third gate electrodes 25-2 indicated by a solid line are commonly connected in the Y direction to clock lines 37 and 38, which are indicated by $V_B(i)$, $V_B(i+1)$, and $V_E(i)$, $V_E(i+1)$, and so forth. The reset drain regions 26 indicated by cross-hatching are commonly connected to a DC power source 35, which is indicated by $V_R$. The semiconductors 23 indicated by hatching are commonly connected in the X direction to signal lines 34, which are indicated by $V_S(j)$, $V_S(j+1)$, and so forth.

FIG. 17 shows a circuit configuration for driving the two dimensional image sensor shown in FIGS. 15A through 15C, and 16A and 16B.

The clock lines 36 connecting the first gate electrodes 24 are commonly connected to the DC power source $V_A$. Moreover, the clock lines 37 and 38 connecting the second gate electrodes 25-1 and the third gate electrode 25-2, respectively, are connected to vertical scanning circuits 40 and 47 by every line. Furthermore, each vertical signal line 34 is connected to a common signal line ($V_O$) 43 via an MOSFET 46. After a constant current load 44 is connected to the common signal line 43, an signal OS is output via a buffer amplifier 45 to the common signal line 43. A scanning signal from a horizontal scanning circuit 42 is supplied to a gate of each MOSFET 46.

As shown in FIG. 17, each amplifying type photoelectric converting device including a first active device 62 and a third active device 63. The first active device 62 is represented by an equivalent circuit including the first gate electrode 24, a transistor and the second gate electrode 25-1, and another transistor connected to the substrate 21 as indicated by $V_D$. The transistor and the second gate electrode 25-1 function as a photoelectric converting device. The third active device 63 is represented by an equivalent circuit including the third gate electrode 25-2, and a transistor connected to the reset drain region 26 as indicated by $V_R$.

FIGS. 18A through 18g show an example of timings of each signal supplied to the driving circuit of the two dimensional image sensor shown in FIG. 17. Herein, $V_B(i)$, $V_E(i)$ represent the (i)th clock line of the clock lines 37 and 38 to which the second gate electrode 25-1 and the third gate electrode 25-2 are respectively connected.

Figure 18A:
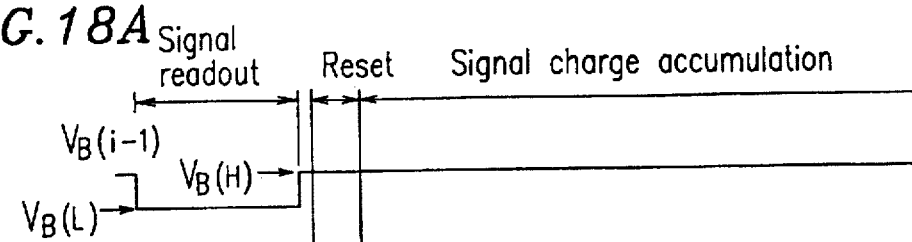
Figure 18B:
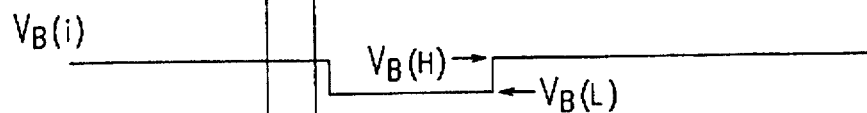
Figure 18C:
Figure 18D:
Figure 18E:
Figure 18F:
Figure 18G:
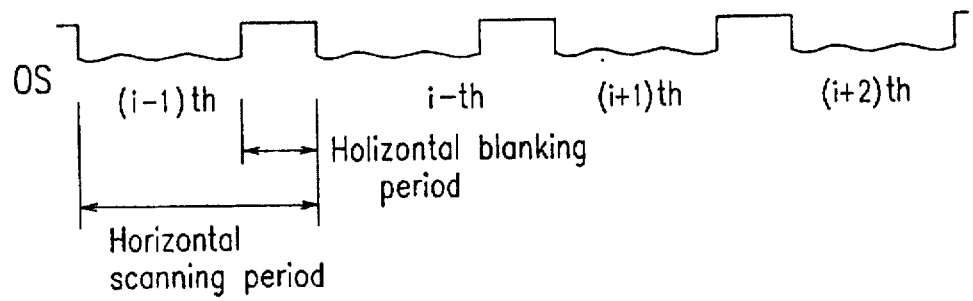

First, in the (i−1)th horizontal scanning period, the (i−1)th horizontal clock line is in a readout operation. By applying a voltage $V_B(L)$ to a clock line $V_B(i-1)$ as shown in FIG. 18A, a signal for a pixel of a horizontal (i−1)th line can be obtained as an output signal OS as shown in FIG. 18G. After the readout operation, a voltage $V_B(H)$ is applied to a clock line $V_B(i-1)$, so as to complete the operation of reading out signals.

In the next horizontal blanking period, a resetting operation starts. A voltage $V_E(H)$ is applied to the clock line $V_E(i-1)$ as shown in FIG. 18D, so as to reset the signal for the pixel of the horizontal (i−1)th line. After the resetting operation, a voltage $V_E(L)$ is applied to the clock line $V_E(i-1)$ as shown in FIG. 18D, so that a signal accumulating operation starts.

Thereafter, in the same manner as shown in FIGS. 18B, 18C and 18E–18G, each operation of readout, reset and signal accumulation for pixels on the next horizontal line sequentially is conducted.

In the amplifying type photoelectric converting device shown in FIG. 13 or the amplifying type solidstate imaging apparatus shown in FIGS. 15A through 15C and 16A and 16B, the dark current can be suppressed in the same manner as described with reference to FIGS. 10A and 10B. FIG. 19 shows potential distributions below the first electrode 24, the second gate electrode 25-1 and the third gate electrode 25-2, which are respectively indicated by a solid line, a broken line and a dash-dot line. In FIG. 19, the potential distribution at the time of accumulating signals is shown on the left, and the potential distribution at the time of reading out signals is shown on the right. Apparent from FIG. 19, the dark current can be suppressed in the same manner as described with reference to FIGS. 10A and 10B except that a voltage $V_E(L)$ remains applied to the third gate electrode 25-2.

Although in the above examples, the case where the voltage $V_A$ applied to the first gate electrode is constant have been described, it is not necessary that the voltage $V_A$ be constant. In each operation of accumulating signals, reading out signals and resetting signals, it is sufficient that potentials are distributed so that holes and electrons are accumulated and moved in accordance with the potential distribution formed below the first gate electrode and the potential distribution below the second gate electrode. Therefore, it is sufficient that the voltage $V_A$ is set so that the potential distribution below the first gate electrode has a predetermined relationship with respect to the potential distribution formed by the voltage $V_R$ applied to the second gate electrode. The voltage $V_A$ can be fluctuated. Furthermore, the voltage $V_A$ can be also fluctuated in the amplifying type photoelectric converting device having the third gate electrode.

In the amplifying type photoelectric converting device or the amplifying type solid-state imaging apparatus described above, a p-type semiconductor substrate is used, and electrons generated by photoelectric conversion are accumulated as signal charges, so as to sense a change in the electrical characteristic of holes caused by the accumulation of the signal charges. However, the present invention is not limited to the examples described above, but can be applied to an amplifying type photoelectric converting device having an opposite polarity.

For example, an amplifying type photoelectric converting device can have a structure shown in FIG. 20. As shown in FIG. 20, a p-type well 122 is formed inside a substrate 121 formed of an n-type semiconductor, in contact with a main surface 151 of the n-type semiconductor substrate 121. Furthermore, an $n^+$ type semiconductor region 123 is formed inside the well 122, in contact with the main surface 151. A first gate electrode 124 is formed in a region excluding the semiconductor region 123 in the well 122 via an insulating film 152. A second gate electrode 125 is formed in a region adjacent to the well 122 in the substrate 121 via an insulating film 152. A surface-proximate portion 153 in the well 122 on which the insulating film 152 is provided, the insulating film 152 and the first gate electrode 124 are included in a first gate region 155. Furthermore, a surface-proximate portion 154 in the substrate 121 on which the insulating film 152 is provided, the insulating film 152 and the second gate electrode 125 are included in a second gate region 156. Furthermore, a reset drain region 126 is provided in the substrate 121 so as to be in contact with the main surface 151 and be adjacent to the surface-proximate portion 154 in the second gate region 156 in the side opposite to the first gate region 155.

In such a structure, a suitable voltage is applied to the first gate electrode 124, so that an n-channel for electrons which are minor carriers is formed in the surface-proximate portion 153 in the first gate region 155. Furthermore, a suitable voltage is applied to the second gate electrode 125, so that the entire substrate 121 located below the second gate electrode 125 including the surface-proximate portion 154 in the second gate region 156 forms an n channel. Therefore, a channel for allowing a current in the form of electrons to flow between the substrate 121 to which a voltage $V_D$ is applied and the semiconductor region 123 to which a voltage $V_S$ is applied is formed. Accordingly, as indicated by a solid line in FIG. 20, the current flows.

When light hυ enters to penetrate the first gate electrode 124 so as to go into the substrate 121, a pair of electron and hole is generated due to photoelectric conversion in the well 122 and the semiconductor substrate 121 which are located below the first gate electrode 124. The generated electrons flow into the semiconductor region 123, while holes are accumulated in a "potential well" formed in the middle of the well 122 so as to become signal charges. The holes to become the signal charges are major carriers in the well 122. The accumulated signal charges vary a potential in the well 122 in accordance with an amount of the charges, and also vary a surface potential of the surface-proximate portion 153 in the first gate region 155.

Therefore, the current flowing between the substrate 121 and the semiconductor region 123 is varied in accordance with the amount of the accumulated signal charges. When a constant current is allowed to flow between the substrate 121 and the semiconductor region 123, an electric potential between the substrate 121 and the semiconductor region 123 is varied in accordance with the amount of the accumulated signal charges. On the other hand, an electric potential between the substrate 121 and the semiconductor region 123 is kept constant, a current flowing between the substrate 121 and the semiconductor region 123 is varied in accordance with the amount of the accumulated signal charges. In this manner, a first active device having the surface-proximate portions 153 and 154 in the first and second gate regions 155 and 156 as a channel is formed. Thus, electrical characteristics of the active device are varied in accordance with the amount of the accumulated signal charges.

When a suitable voltage is applied to the second gate electrode 125, so as to lower the potential barrier of the surface-proximate portion 154 of the second gate region 156, the signal charges accumulated in the well 122 flow along the path indicated by a dotted line in FIG. 20 to the reset drain region 126. In this manner, a second active device having the surface-proximate portion 154 in the second gate region 156 as a channel is formed between the well 122 and the reset drain region 126. Thus, the signal charges are discharged.

According to the amplifying type photoelectric converting device and the amplifying type solid-state imaging apparatus of the present invention, carriers generated in the deep portion of the substrate by photo-electric conversion can be accumulated as signal charges. Accordingly, in a simple structure, light having a wavelength in a wide range from a short wavelength to a long wavelength can be sensed with high sensitivity.

In the case where a DC current is applied to the electrodes in the photoelectric conversion region to drive the device, it is not necessary to reduce a resistance of the electrodes. Thus, a sensitivity for reception of light can be enhanced by reducing the film thickness and introducing light in a large quantity into the substrate. On the other hand, in the case where a clock signal is applied to the electrodes in the photoelectric conversion region, an electrical potential supplied to a pixel during a readout operation can be different from that to a pixel during a signal accumulation operation. Thus, the dark current can be suppressed by injecting carriers in the photoelectric conversion region in the pixel during the signal accumulation operation.

Furthermore, a voltage required for resetting can be reduced by providing the third gate electrode in a part of the well, and allowing the third gate electrodes to have the reset function. Moreover, a voltage to be applied to the second gate electrode at the time of resetting can be reduced by providing a first impurity layer having an impurity concentration higher than the semiconductor substrate below the second gate electrodes. By such a structure, the amplifying type photoelectric converting device and the amplifying type solid-state imaging apparatus can be driven at a low voltage.

Furthermore, the deterioration in resolution can be suppressed by providing a second impurity layer having an impurity concentration higher than the semiconductor substrate below the first gate region.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An amplifying type photoelectric converting device, comprising:

a semiconductor substrate of a first conductive type;

a well portion of a second conductive type for accumulating signal charges generated by photoelectric conversion, the well portion being provided in one surface side of the semiconductor substrate;

a semiconductor region of the first conductive type provided in a region in one surface side of the well portion;

a first gate region including a surface-proximate portion in a region excluding the semiconductor region in the well portion, an insulating film located on the surface-proximate portion, and a first electrode located on the insulating film; and a second gate region adjacent to the first gate region in the one surface side of the semiconductor substrate, the second gate region including a surface-proximate portion in the semiconductor substrate, an insulating film located on the surface-proximate portion in the semiconductor substrate, and a second electrode located on the insulating film, wherein an active element having the surface-proximate portion of the first gate region as a channel is formed between the semiconductor region and the semiconductor substrate, and a change in an operational characteristic of the active element which is generated by the signal charges is used as an output signal.

2. An amplifying type photoelectric converting device according to claim 1, further comprising a first impurity layer of the first conductive type provided on the surface-proximate portion of the second gate region, the first impurity layer including an impurity of a concentration higher than in the semiconductor substrate.

3. An amplifying type photoelectric converting device according to claim 1, further comprising a second impurity layer of the first conductive type provided at least in the semiconductor substrate below the first gate region, the second impurity layer including an impurity of a concentration higher than in the semiconductor substrate.

4. An amplifying type solid-state imaging apparatus, comprising:
the amplifying type photoelectric converting device according to claim 1; and
a drive control section for controlling operation of the amplifying type solid-state imaging apparatus,
wherein the drive control section operates for the amplifying type photoelectric converting device such that:
the drive control circuit applies to the first electrode a predetermined electric potential; and
the drive control circuit applies to the second electrode an electric potential $V_M$ in a period of accumulating the signal charges in the well portion and an electric potential $V_L$ in a period of reading out the output signal, the electric potential $V_M$ functioning as a barrier against the signal charges and the output signal, the electric potential $V_L$ functioning as a barrier against the signal charges and accepting the output signal,
thereby realizing control in which the accumulation of the signal charges and the readout operation of the output signal as the change in the operational characteristic of the active element caused by the signal charges are performed.

5. An amplifying type solid-state imaging apparatus, comprising:
the amplifying type photoelectric converting device according to claim 1; and
a drive control section for controlling operation of the amplifying type solid-state imaging apparatus,
wherein the drive control section operates for the amplifying type photoelectric converting device such that:
in a period of reading out the output signal, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal; and
in a period of accumulating charges in the well portion, the drive control section applies an electric potential $V_A'$ which is lower than the electric potential $V_A$ to the first electrode and an electric potential $V_M$ to the second electrode, the electric potential $V_M$ functioning as a barrier against the signal charges and output signal,
thereby realizing control in which the accumulation of the signal charges and the readout operation of the output signal as the change in the operational characteristic of the active element caused by the signal charges are performed.

6. An amplifying type solid-state imaging apparatus, comprising:
a plurality of the amplifying type photoelectric converting devices each according to claim 1, the semiconductor region of the respective amplifying type photoelectric converting devices being electrically connected with each other; and
a drive control section for controlling operation of the amplifying type solid-state imaging apparatus,
wherein the drive control section operates such that:
for one of the amplifying type photoelectric converting devices, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal, thereby reading out the output signal; and
for the rest of the amplifying type photoelectric converting devices, the drive control section applies the electric potential $V_A$ or an electric potential $V_A'$ which is lower than the electric potential $V_A$ to the respective first electrodes, and an electric potential $V_M$ to the respective second electrodes, the electric potential $V_M$ functioning as a barrier against the signal charges and the output signal, thereby accumulating the signal charges.

7. An amplifying type solid-state imaging apparatus, comprising a plurality of the amplifying type photoelectric converting devices each according to claim 1, wherein the amplifying type photoelectric converting devices are adjacently arranged in one direction or in two directions which are crossing with each other, the respective amplifying type photoelectric converting devices forming pixels, and the reset drain region in a stripe-shape or in an island-shape is provided between the adjacent pixels.

8. An amplifying type solid-state imaging apparatus according to claim 7, wherein each of the pixels formed by the plurality of amplifying type photoelectric converting devices is separated from the adjacent pixels by the second electrode.

9. An amplifying type photoelectric converting device, comprising:
a semiconductor substrate of a first conductive type;
a well portion of a second conductive type for accumulating signal charges generated by photoelectric conversion, the well portion being provided in one surface side of the semiconductor substrate;
a semiconductor region of the first conductive type provided in a region in one surface side of the well portion;
a first gate region including a surface-proximate portion in a region excluding the semiconductor region in the well portion, an insulating film located on the surface-proximate portion, and first electrode located on the insulating film;
a second gate region adjacent to the first gate region in the one surface side of the semiconductor substrate, the second gate region including a surface-proximate portion in the semiconductor substrate, an insulating film located on the surface-proximate portion in the semiconductor substrate, and second electrodes located on the insulating film; and
a reset drain region of the second conductive type provided in the one surface side of the semiconductor substrate,
wherein a first active element having the surface-proximate portion of the first gate region as a channel is formed between the semiconductor region and the semiconductor substrate, and a second active element having a region between the well portion and the reset drain region as a channel is formed, and a change in an operational characteristic of the first active element which is generated by the signal charges is used as an output signal.

10. An amplifying type photoelectric converting device according to claim 9, further comprising a first impurity layer of the first conductive type provided on the surface-proximate portion of the second gate region, the first impurity layer including an impurity of a concentration higher than in the semiconductor substrate.

11. An amplifying type photoelectric converting device according to claim 9, further comprising a second impurity layer of the first conductive type provided at least in the semiconductor substrate below the first gate region, the second impurity layer including an impurity of a concentration higher than in the semiconductor substrate.

12. An amplifying type solid-state imaging apparatus, comprising:

the amplifying type photoelectric converting device according to claim 9; and a drive control section for controlling operation of the amplifying type solid-state imaging apparatus, wherein the drive control section operates for the amplifying type photoelectric converting device such that:
the drive control section applies to the first electrode a predetermined electric potential; and
the drive control section applies to the second electrode an electric potential $V_L$ in a period of reading out the output signal, an electric potential $V_M$ in a period of accumulating the signal charges in the well portion, and an electric potential $V_H$ in a period of resetting, the electric potential $V_L$ functioning as a barrier against the signal charges and accepting the output signal, the electric potential $V_M$ functioning as a barrier against the signal charges and the output signal, the electric potential $V_H$ functioning as a barrier against the output signal and accepting the signal charges, thereby realizing control in which the accumulation of the signal charges, the readout operation of the output signal as the change in the operational characteristic of the first active element caused by the signal charges, and the discharging operation of the signal charges to the reset drain region are performed.

13. An amplifying type solid-state imaging apparatus, comprising:

the amplifying type photoelectric converting device according to claim 9; and a drive control section for controlling operation of the amplifying type solid-state imaging apparatus, wherein the drive control section operates for the amplifying type photoelectric converting device such that:
in a period of reading out the output signal, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal;
in a period of accumulating charges in the well portion, the drive control section applies an electric potential $V_A'$ which is lower than the electric potential $V_A$ to the first electrode and an electric potential $V_M$ to the second electrode, the electric potential $V_M$ functioning as a barrier against the signal charges and the output signal; and
in a period of resetting, the drive control section applies an electric potential $V_H$ to the second electrode, the electric potential $V_H$ functioning as a barrier against the output signal and accepting the signal charges, thereby realizing control in which the accumulation of the signal charges, the readout operation of the output signal as the change in the operational characteristic of the first active element caused by the signal charges, and the discharging operation of the signal charges to the reset drain region are performed.

14. An amplifying type solid-state imaging apparatus, comprising:

a plurality of the amplifying type photoelectric converting devices each according to claim 9, the semiconductor region of the respective amplifying type photoelectric converting devices being electrically connected with each other; and a drive control section for controlling operation of the amplifying type solid-state imaging apparatus, wherein the drive control section operates such that:
for one of the amplifying type photoelectric converting devices, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal, thereby reading out the output signal; and for the rest of the amplifying type photoelectric converting devices, the drive control section applies the electric potential $V_A$ or an electric potential $V_A'$ which is lower than the electric potential $V_A$ to the respective first electrodes and an electric potential $V_M$ to the respective second electrodes, the electric potential $V_M$ functioning as a barrier against the signal charges and the output signal, thereby accumulating the signal charges.

15. An amplifying type solid-state imaging apparatus, comprising a plurality of the amplifying type photoelectric converting devices each according to claim 9, wherein the amplifying type photoelectric converting devices are adjacently arranged in one direction or in two directions which are crossing with each other, the respective amplifying type photoelectric converting devices forming pixels, and the reset drain region in a stripe-shape or in an island-shape is provided between the adjacent pixels.

16. An amplifying type solid-state imaging apparatus according to claim 15, wherein a plurality of pixels are arranged by the plurality of amplifying type photoelectric converting devices, and each of the pixels are separated from the adjacent pixels by the second electrode.

17. An amplifying type photoelectric converting device, comprising:

a semiconductor substrate of a first conductive type;

a well portion of a second conductive type for accumulating signal charges generated by photoelectric conversion, the well portion being provided in one surface side of the semiconductor substrate;

a semiconductor region of the first conductive type provided in a region in one surface side of the well portion;

a first gate region including a surface-proximate portion in a region excluding the semiconductor region in the well portion, an insulating film located on the surface-proximate portion, and a first electrode located on the insulating film;

a second gate region adjacent to the first gate region in the one surface side of the semiconductor substrate, the second gate region including a surface-proximate portion in the semiconductor substrate, an insulating film on the surface-proximate portion in the semiconductor substrate, and a second electrode on the insulating film;

a third gate region adjacent to the first gate region that is in the one surface side of the well portion, the third gate region including a surface-proximate portion in the semiconductor substrate, an insulating film located on the surface-proximate portion in the semiconductor substrate, and a third electrode located on the insulating film; and a reset drain region of the second conductive type provided in the one surface side of the semiconductor substrate and adjacent to the surface-proximate portion in the third gate region, wherein a first active element having the surface-proximate portion of the first gate region as a channel is formed between the semiconductor region and the semiconductor substrate, and a third active element having a region between the well portion and the reset drain region as a channel is formed, and a change in an operational characteristic which is generated by the signal charges in the first active element is used as an output signal.

18. An amplifying type photoelectric converting device according to claim 17, further comprising a first impurity layer of the first conductive type provided on the surface-proximate portion of the second gate region, the first impurity layer including an impurity of a concentration higher than in the semiconductor substrate.

19. An amplifying type photoelectric converting device according to claim 17, further comprising a second impurity layer of the first conductive type provided at least in the semiconductor substrate below the first gate region, the second impurity layer including an impurity of a concentration higher than in the semiconductor substrate.

20. An amplifying type solid-state imaging apparatus, comprising:

the amplifying type photoelectric converting device according to claim 17; and a drive control section for controlling operation of the amplifying type solid-state imaging apparatus, wherein the drive control section operates for the amplifying type photoelectric converting device such that:

the drive control section applies to the first electrode a predetermined electric potential; and in a period of reading out the output signal, the drive control section applies an electric potential $V_L$ to the second electrode and an electric potential $V_L'$ to the third electrode, the electric potential $V_L$ functioning as a barrier against the signal charges and accepting the output signal, the electric potential $V_L'$ functioning as a barrier against the signal charges and the output signal;

in a period of accumulating charges in the well portion, the drive control section applies an electric potential $V_M$ to the second electrode and an electric potential $V_L''$ to the third electrode, the electric potentials $V_M$ and $V_L''$ both functioning as a barrier against the signal charges and the output signal; and in a period of resetting, the drive control section applies an electric potential $V_M'$ to the second electrode and an electric potential $V_H'$ to the third electrode, the electric potentials $V_M'$ functioning as a barrier against the signal charges and the output signal, the electric potentials $V_H'$ functioning as a barrier against the output signal, thereby realizing control in which the accumulation of the signal charges, the readout operation of the output signal as the change in the operational characteristic of the first active element caused by the signal charges, and the discharging operation of the signal charges to the reset drain region are performed.

21. An amplifying type solid-state imaging apparatus, comprising:

the amplifying type photoelectric converting device according to claim 17; and a drive control section for controlling operation of the amplifying type solid-state imaging apparatus, wherein the drive control section operates for the amplifying type photoelectric converting device such that:

in a period of reading out the output signal, the drive control section applies an electric potential $V_A$ to the first electrode, an electric potential $V_L$ to the second electrode and an electric potential $V_L'$ to the third electrode, the electric potential $V_A$ making a surface potential below the first electrode higher than an electric potential of the semiconductor substrate, the electric potential $V_L$ functioning as a barrier against the signal charges and accepting the output signal, the electric potential $V_L'$ functioning as a barrier against the signal charges and the output signal;

in a period of accumulating charges in the well portion, the drive control section applies an electric potential $V_A'$ which is lower than the electric potential $V_A$ to the first electrode, an electric potential $V_M$ to the second electrode and an electric potential $V_L''$ to the third electrode, the electric potentials $V_M$ and $V_l''$ both functioning as a barrier against the output signal charges and the output signal; and in a period of resetting, the drive control section applies an electric potential $V_M'$ to the second electrode and an electric potential $V_H'$ to the third electrode, the electric potentials $V_M$ functioning as a barrier against the signal charges and the output signal, the electric potentials $V_H'$ functioning as a barrier against the output signal, thereby realizing control in which the accumulation of the signal charges, the readout operation of the output signal as the change in the operational characteristic of the first active element caused by the signal charges, and the discharging operation of the signal charges to the reset drain region are performed.

22. An amplifying type solid-state imaging apparatus, comprising:

a plurality of the amplifying type photoelectric converting devices each according to claim 17, the semiconductor region of the respective amplifying type photoelectric converting devices being electrically connected with each other; and a drive control section for controlling operation of the amplifying type solid-state imaging apparatus, wherein the drive control section operates such that:

for one of the amplifying type photoelectric converting devices, the drive control section applies an electric potential $V_A$ to the first electrode and an electric potential $V_L$ to the second electrode, the electric potential $V_A$ making a surface potential below the first electrode higher than an electric potential of the semiconductor substrate, the electric potential $V_L$ functioning as a barrier against the signal charges and accepting the output signal, thereby reading out the output signal; and for the rest of the amplifying type photoelectric converting devices, the drive control section applies the electric potential $V_A$ or an electric potential $V_A'$ which is lower than the electric potential $V_A$ to the respective first electrodes and an electric potential $V_M$ to the respective second electrodes, the electric potential $V_M$ functioning as a barrier against the signal charges and the output signal, thereby accumulating the signal charges.

23. An amplifying type solid-state imaging apparatus, comprising a plurality of the amplifying type photoelectric converting devices each according to claim 17, wherein the amplifying type photoelectric converting devices are adjacently arranged in one direction or in two directions which are crossing with each other, the respective amplifying type photoelectric converting devices forming pixels, and the reset drain region in a stripe-shape or in an island-shape is provided between the adjacent pixels.

24. An amplifying type solid-state imaging apparatus according to claim 23, wherein a plurality of pixels are arranged by the plurality of amplifying type photoelectric converting devices, and each of the pixels are separated from the adjacent pixels by the second electrode.

* * * * *